(12) United States Patent
Fukuda et al.

(10) Patent No.: US 7,993,980 B2
(45) Date of Patent: Aug. 9, 2011

(54) LEAD FRAME, ELECTRONIC COMPONENT INCLUDING THE LEAD FRAME, AND MANUFACTURING METHOD THEREOF

(75) Inventors: Toshiyuki Fukuda, Kyoto (JP); Yoshihiro Tomita, Osaka (JP); Hisashi Umeda, Shiga (JP); Yasutake Yaguchi, Osaka (JP)

(73) Assignee: Panasonic Corporation, Osaka (JP)

( * ) Notice: Subject to any disclaimer, the term of this patent is extended or adjusted under 35 U.S.C. 154(b) by 372 days.

(21) Appl. No.: 12/210,312

(22) Filed: Sep. 15, 2008

(65) Prior Publication Data

US 2009/0091013 A1    Apr. 9, 2009

(30) Foreign Application Priority Data

Oct. 4, 2007    (JP) ................. 2007-260634

(51) Int. Cl.
*H01L 21/00* (2006.01)
*H01L 23/495* (2006.01)

(52) U.S. Cl. ...................... 438/123; 257/666
(58) Field of Classification Search .................. 438/123; 257/666

See application file for complete search history.

(56) References Cited

U.S. PATENT DOCUMENTS

| | | | |
|---|---|---|---|
| 5,471,088 A | 11/1995 | Song | |
| 5,770,888 A | 6/1998 | Song et al. | |
| 7,517,733 B2 * | 4/2009 | Camacho et al. | 438/123 |
| 7,709,935 B2 * | 5/2010 | Islam et al. | 257/666 |
| 7,816,769 B2 * | 10/2010 | Lam | 257/666 |
| 2003/0038347 A1 * | 2/2003 | Chiu et al. | 257/678 |
| 2003/0071333 A1 * | 4/2003 | Matsuzawa | 257/676 |
| 2005/0054141 A1 * | 3/2005 | Kim et al. | 438/111 |
| 2005/0093117 A1 | 5/2005 | Masuda et al. | |
| 2005/0194676 A1 | 9/2005 | Fukuda et al. | |
| 2006/0163703 A1 * | 7/2006 | Minamio et al. | 257/666 |
| 2008/0251898 A1 * | 10/2008 | Itou et al. | 257/666 |
| 2010/0127363 A1 * | 5/2010 | Nondhasitthichai et al. | 257/673 |

FOREIGN PATENT DOCUMENTS

| | | |
|---|---|---|
| JP | 3388609 | 1/2003 |
| JP | 2007-27526 | 2/2007 |
| JP | 2007-141994 | 6/2007 |

OTHER PUBLICATIONS

English language Abstract of JP 2007-27526, Feb. 1, 2007.
English language Abstract of JP 62-9069, Jul. 26, 1994.
English language Abstract of JP 2007-141994, Jun. 7, 2007.

* cited by examiner

*Primary Examiner* — Matthew C Landau
*Assistant Examiner* — James M Mitchell
(74) *Attorney, Agent, or Firm* — Greenblum & Bernstein P.L.C.

(57) ABSTRACT

A lead frame of the present invention includes: a die pad on which a device is mounted; a first connection terminal which is provided around the die pad, and the lower surface of which serves as an external terminal; a second connection terminal which is provided around the die pad and electrically independent of the die pad, and the upper surface of which serves as an external terminal; a bent part provided between the first and the second connection terminals and connecting the first and the second connection terminals; and an outer frame. The bent part is bending-processed in a direction perpendicular to a face of the die pad. Within the outer frame, electronic component regions are formed adjoining each other and each including a die pad, and the first and the second connection terminals. The adjoining electronic components are connected through the first or the second connection terminal.

17 Claims, 14 Drawing Sheets

Lead frame 900
Terminal 916
Semiconductor device
Separation frame 914
Suspension lead 915
Suspension die pad 930

Separation line 908
Metal wire 906
Separation line 908
909
907
903
916
A-A' cross section

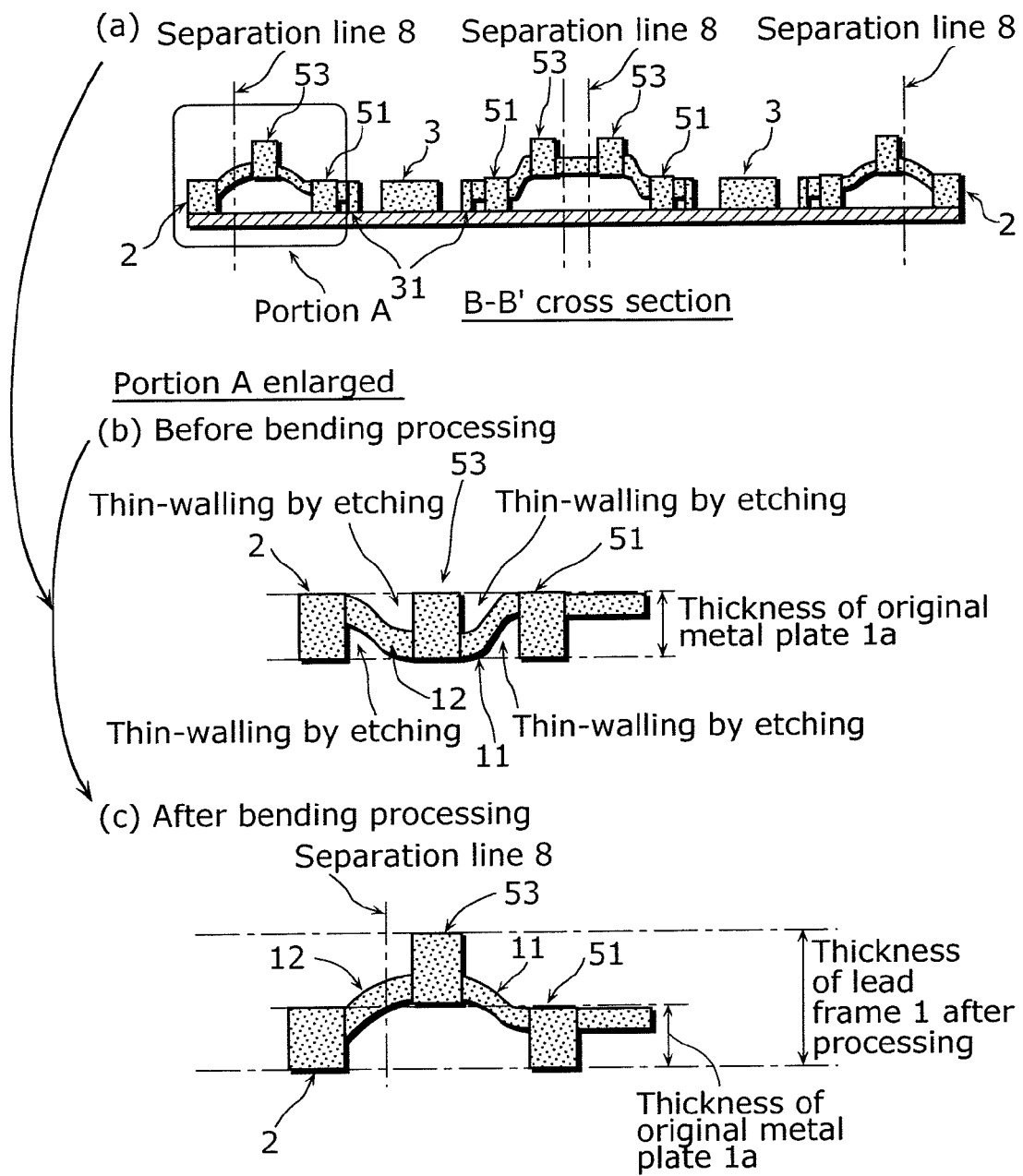

A-A' cross section

B-B' cross section

※To be arbitrarily exposed where necessary

Second terminal
(on external
terminal side)
53

A-A' cross section

B-B' cross section

First terminal
4 (on external
terminal side)

Second
terminal 51
※To be arbitrarily
exposed
where necessary

Die pad 3

A-A' cross section

B-B' cross section

Die pad 30 — Device 90 — Second terminal (on external terminal side) 73 — Second terminal 70 — First terminal 60 — 80 — Encapsulation resin 100

A-A' cross section

B-B' cross section

Second terminal (on external terminal side) 73

A-A' cross section

B-B' cross section

Die pad 30

First terminal (on external terminal side) 60

Second terminal 71
※To be arbitrarily exposed where necessary

LEAD FRAME, ELECTRONIC COMPONENT INCLUDING THE LEAD FRAME, AND MANUFACTURING METHOD THEREOF

BACKGROUND OF THE INVENTION (1) Field of the Invention

The present invention relates to a lead frame, an electronic component including the lead frame, and a manufacturing method thereof, and relates in particular to a lead frame used for internal wiring within a device package, for connecting the device and external wiring, an electronic component including the lead frame and a manufacturing method thereof.

(2) Description of the Related Art

In recent years, as cellular phones and digital appliances, is such as DVD apparatuses and digital TVs, have become more downsized, sophisticated, and multifunctional, semiconductors and electronic components used in digital appliances are expected to be further thinned, miniaturized, and high-densified, while cost reduction is required of the packages used in semiconductor devices and electronic components.

Packages used in semiconductor devices and electronic components include, for example, a package using a multilayer wiring board on which semiconductor chips and electronic components are stacked in layers.

FIG. 1 is a cross-sectional view of a package 800 using a multilayer wiring board on which devices are stacked.

The package 800 includes: a metal wire 806, encapsulation resin 807, a device 809, a wiring board 813, and an external terminal 816.

The wiring board 813 is made up of multiple layers, including internal wiring layers 817 and via holes 819. Here, the internal wiring layers 817 are connected to through holes, that is, the via holes 819.

The wiring board 813 has a device 809 stacked on the superior surface.

External terminals 816 are formed on both surfaces of the wiring board 813 as upper and lower terminals. The external terminals 816, for example, are solder bumps. In addition, the external terminals 816 are electrically connected, through the via holes 819, to the internal wiring layers 817.

The device 809, for example, is a semiconductor chip. The device 809 is electrically connected to the internal wiring layers 817 through the metal wire 806. In addition, the device 809 and the metal wire 806 provided on the surface of the wiring board 813 are sealed with the encapsulation resin 807. On the surface of the wiring board 813, external terminals 816 that serve as the upper terminals are formed on the periphery of the encapsulation resin.

Although having an advantage in the degree of freedom in wiring layouts and so on, organic boards have nevertheless lower connection reliability, as compared to lead frames, in terms of humidity resistance and so on. In addition, when using multilayer wiring boards, it is not possible to achieve cost reduction for reasons of increased costs and so on.

Thus, various suggestions are made concerning the package using a lead frame including upper and lower external terminals (for example, Patent References 1 to 3).

Japanese Unexamined Patent Application Publication No. 2007-27526 (Patent Reference 1) describes use of a lead frame or a wiring board on which terminals, the lower surfaces of which serve as external terminals, are formed, and stud bumps are formed on the upper surface of such terminals. The Patent Reference 1 suggests a semiconductor-device package including upper and lower terminals and a manufacturing method thereof, in which the tips of the stud bumps, exposed on the upper surface of the package, serve as external terminals for the upper surface of the package.

Japanese Patent No. 3388609 (Patent Reference 2) describes an L-shaped lead portion placed and secured onto an adhesion tape. On the lead portion, a semiconductor chip is mounted. The L-shaped lead portion and the semiconductor chip are encapsulated with resin. The Patent Reference 2 suggests a semiconductor-device package including external terminals that serve as upper and lower terminals for the package through exposure of the upper and lower portions of the lead onto the surface of the encapsulating resin.

Japanese Unexamined Patent Application Publication No. 2007-141994 (Patent Reference 3) suggests a semiconductor-device package using a lead frame including upper and lower terminals. In addition, the external terminals on the upper side of the package are processed after the package is separated into each region corresponding to each semiconductor device.

Such conventional packages, however, have the following problems.

The Patent Reference 1 describes that the stud bumps are formed on the upper surfaces of the terminals formed in the lower-surface side of the package in the semiconductor device. However, the upper surfaces of the terminals, on which the stud bumps are formed, are small in area. In addition, it is difficult to control the height of the stud bumps such that the areas of the external terminals exposed on the upper surface of the package are evenly sized. Thus, the area size of the external terminals exposed on the upper surface of the package becomes uneven. Therefore, such external terminals have lower connection reliability and unstable strength when connected to a wiring board or a device. Furthermore, in an embodiment using a board, intra-board wiring and a land for a via hole for ensuring electrical continuity are internally formed in the substrate; however, there is a possibility that reliability might decrease due to the inclusion of plural connection parts for connecting the intra-board wiring and the land for a via hole.

The Patent Reference 2 describes that the L-shaped lead portion is formed vertically through the package in the semiconductor device. Plural packages and devices are stacked on the package. The package, and the plural packages and devices stacked on the package are layered through the L-shaped lead portion and electrically connected to each other through the L-shaped lead portion. Such an L-shaped lead portion, through which the packages and devices are stacked and electrically connected, is made of a hard material such as metal. Therefore, it is not possible to reduce bending stress and thermal stress on the L-shaped lead portion, thus significantly decreasing the connection reliability of products made up of packages and devices stacked in layers. In addition, every L-shaped lead portion in each stacked package is disposed at the same position in the stacking direction, and therefore it is difficult to change the design of the L-shaped lead portion, that is, the terminal position of each stacked package.

Patent Reference 3 discloses the processing of external terminals that serve as upper and lower terminals. However, the external terminals on the upper side of the package are processed after the lead frame is separated into each region corresponding to each semiconductor device. After the processing, the terminals on the upper side of the package are suspended in the air having the ends open, and this makes assembly difficult; that is, the manufacturing is not easy. In addition, since the upper-side terminals that serve as external terminals of the package and to be resin-encapsulated are not secured, there is a possibility that the upper-side terminals might be buried in the resin. Furthermore, in terms of resin encapsulation, no substantial manufacturing method is disclosed in detail.

Here, a common lead frame shall be described referring to the Quad Flat Non-Lead Package (QFN).

FIGS. 2A and 2B are diagrams showing a common lead frame used for the QFN for collective encapsulation molding. Here, the QFN refers to a semiconductor-device package which includes a semiconductor chip or the like connected to a metal lead by wire bonding, and which includes only a single line of leads provided as external terminals for implementation that appear from the molded body on the four sides, the bottom surface, or each side of the bottom surface of the package.

FIG. 2A is a plan view of a common lead frame used in the QFN. FIG. 2B is a cross-sectional view of a resin-encapsulated QFN before separation.

The QFN before separation includes a die pad 903, a metal wire 906, encapsulation resin 907, and a device 909.

A lead frame 900 includes a die pad 903, a separation frame 914, a suspension lead 915, and a terminal 916.

In FIG. 2A, a region shown by alternate long and short dash lines is the region to be a semiconductor device.

The lead frame 900 is used for the QFN for collective encapsulating molding, with a plurality of regions that is to be semiconductor devices being provided in a matrix.

The separation frame 914 is formed as a metal portion near the boundary of the adjoining semiconductor-device regions. To the separation frame 914, the suspension lead 915 supporting the die pad 903 and the terminal 916 are connected.

FIG. 2B is a diagram corresponding to the A-A' cross section of the lead frame 900.

In the QFN before separation, a device 909 is mounted on the die pad 903, and the electrodes of the device 909 are electrically connected by the metal wire 906 to the terminal 916.

In addition, in the QFN before separation, the device 909 and the metal wire 906 are sealed with the encapsulation resin 907 at the side to which the metal wire 906 of the terminal 916 is connected.

In the QFN, the separation frame 914 is cut off with a blade along a separation line 908. However, when cutting off the separation frame 914 with a blade, the blade is under stress since the entire separation frame 914 is made of metal. This shortens the blade life as a result of blade breakage and so on, causing unnecessary increases in costs. In addition, metal burrs are generated in the cut surfaces at which the separation frame 914 is cut off with the blade. This causes the problem of decreased reliability, such as contact failure occurring at adjacent terminals 916.

SUMMARY OF THE INVENTION

The present invention is conceived in view of the above problems, and it is an object of the present invention to provide a lead frame, an electronic component including the lead frame, and a manufacturing method thereof that allow easy manufacturing and cost reduction while preventing decreases in reliability.

To solve the above problems, the lead frame according to the present invention is a lead frame used for internal wiring of a package of a device and for connecting the device to external wiring, and the lead frame includes: an outer frame; and a plurality of electronic component regions adjoining each other within the outer frame, in which each of the plurality of electronic component regions includes: a die pad on which the device is mounted; a first connection terminal, a lower surface of which serves as an external terminal, the first connection terminal being provided around the die pad and electrically independent of the die pad; a second connection terminal, an upper surface of which serves as an external terminal, the second connection terminal being provided around the die pad and electrically independent of the die pad; and a bent part that is provided between the first connection terminal and the second connection terminal, and that connects the first connection terminal and the second connection terminal, the bent part is bending-processed in a direction perpendicular to a face of the die pad, the plurality of electronic component regions adjoining each other is connected through the first or the second connection terminal, and a separation frame is not formed in the lead frame, the separation frame surrounding and securing by connecting, the plurality of electronic component regions.

In addition, the upper surface of the second connection terminal may be positioned higher than upper surfaces of the first connection terminal and the die pad.

According to the structure, it is possible to readily adjust the height of the second outer terminal that serves as an external terminal by including and bending-processing the bent part, thereby allowing realization of the lead frame including upper and lower external terminals using a single piece of lead frame, without using a wiring board. In addition, with such flexibility in designing the position and the area size of the external terminal, it is possible to ensure the diversity of designs. In addition, since no separation frame is provided at the boundary of the electronic component regions, it is possible to reduce the stress onto the dicing blade resulting from the cutting of the lead frame with respect to each electronic component region, thereby making the life of the dicing blade longer. In addition, since no separation frame is provided at the boundary of the electronic component regions, it is possible to significantly reduce the number of cut surfaces in the metal cut off by the dicing blade as compared to the conventional lead frame including a separation frame, thereby preventing contact failure caused by metal burrs in the cut surfaces of such adjoining electronic component regions, thereby making it possible to realize a lead frame that allow easy manufacturing and cost reduction while preventing decreases in reliability.

In addition, the bent part may be thinner than the second connection terminal and be formed connected to a lower portion of the second connection terminal.

In addition, the bent part may be half or less than half a thickness of the second connection terminal.

According to the structure, since the bent part leading to the second connection terminal is readily bending-processed, it is possible to readily adjust the height of the second connection terminal that serves as an external terminal.

In addition, the bent part may be thinner than the first connection terminal and be formed connected to an upper portion of the first connection terminal.

In addition, the bent part may be half or less than half a thickness of the first connection terminal.

According to the structure, since the bent part leading to the first connection terminal is readily bending-processed, it is possible to readily adjust the height of the second connection terminal that serves as an external terminal.

In addition, the lower surface of the first connection terminal and a lower surface of the outer frame may be adhered to tape and secured.

According to the structure, the lower surface of the lead frame, that is, the lower surfaces of the first connection terminal and the outer frame are held and secured onto the securing tape, thereby ensuring not only stable transportation but also stable assembly of the electronic component.

In addition, to solve the above problems, the electronic component according to the present invention is an electronic component including: the lead frame in a first or a sixth aspect of the present invention; and a device mounted on the die pad in the lead frame and including an electrode, in which the electrode is electrically connected to an upper surface of the first connection terminal by metal wiring, the lead frame and the device are sealed with resin so as to be encapsulated, and the lower surface of the first connection terminal is exposed on the resin.

According to the structure, it is possible to readily adjust the height of the second outer terminal that serves as an external terminal by including and bending-processing the bent part, thereby allowing realization of the lead frame including upper and lower external terminals using a single piece of lead frame, without using a wiring board. In addition, with such flexibility in designing the position and the area size of the external terminal, it is possible to ensure the diversity of designs. In addition, since no separation frame is provided at the boundary of the electronic component regions, it is possible to reduce the stress onto the dicing blade resulting from the cutting of the lead frame with respect to each electronic component region, thereby making the life of the dicing blade longer. In addition, since no separation frame is provided at the boundary of the electronic component regions, it is possible to significantly reduce the number of cut surfaces in the metal cut off by the dicing blade as compared to the conventional lead frame including a separation frame, thereby preventing contact failure caused by metal burrs in the cut surfaces of such adjoining electronic component regions, thereby making it possible to realize a lead frame that allow easy manufacturing and cost reduction while preventing decreases in reliability.

In addition, the upper surface of the second connection terminal may be exposed on the resin.

According to the structure, the upper surface of the second connection terminal is exposed on the encapsulation resin and serves as an upper-surface external terminal.

In addition, a connection part that connects, through the second connection terminal, the plurality of electronic component regions adjoining each other is cut off, and a cut surface of the connection part may be exposed on the resin.

At this time, the bent part may be bending-processed so that the cut surface of the connection part, which is cut off and exposed on the resin, is half a height of the electronic component.

With this, resin cracks and metal burrs generated on the cut surface of the connection part are kept from reaching the upper and lower surfaces of the electronic component due to the sandwich effect produced by the encapsulation resin sandwiching both the upper and lower surfaces of the connection part leading to the second connection terminal that is cut off.

In addition, to solve the above problems, the method manufacturing the lead frame according to the present invention is a method of manufacturing a lead frame used for internal wiring of a package of a device and for connecting the device to external wiring, and the method includes: forming, through etching of a metal plate, an outer frame, a die pad on which the device is mounted, and first and second connection terminals around the die pad, the first and second terminals serving as external terminals that are integrally connected to the die pad; thin-walling a joint part that joins the first connection terminal and the die pad, and a bent part that is provided between the first and the second connection terminals and is integrally connected to the first and the second connection terminals; bending, into a direction perpendicular to a face of the die pad, the bent part that is thinned in the thin-walling; securing, using tape, the outer frame and a lower end of the first connection terminal; and cutting off, after the securing, the connection part thinned in the thin-walling, so that the first connection terminal and the die pad are electrically independent.

This makes it possible to realize a lead frame that allows easy manufacturing and cost reduction while preventing decreases in reliability.

At this time, in the thin-walling, the bent part may be thinned so as to lead to a lower portion of the second connection terminal.

At this time, in the thin-walling, the bent part may be thinned so as to lead to an upper portion of the first connection terminal.

At this time, in the bending, an upper surface of the second connection terminal may be positioned higher than upper surfaces of the first connection terminal and the die pad by the bending of the thin-walled bent part.

At this time, in the securing, the second connection terminal may be secured above the tape in a state of being suspended in the air.

At this time, a plurality of lead frames is formed in manufacturing the lead frame; in the forming, an outer frame is further formed for the lead frame, which includes a plurality of electronic component regions each including the die pad and the first and the second connection terminals as one electronic component region; within the outer frame, the plurality of electronic component regions are formed adjoining each other, the electronic component regions including the die pad and the first and the second connection terminals; the plurality of electronic component regions adjoining each other is connected through the first or the second connection terminal; and a separation frame is not formed in the lead frame, the separation frame surrounding and securing by connecting, the plurality of electronic component regions.

According to the present invention, it is possible to provide a lead frame, an electronic component, and a manufacturing method thereof that allow easy manufacturing and cost reduction while preventing decreases in reliability.

FURTHER INFORMATION ABOUT TECHNICAL BACKGROUND TO THIS APPLICATION

The disclosure of Japanese Patent Application No. 2007-260634 filed on Oct. 4, 2007 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention.

In the Drawings:

FIG. 4 is a diagram conceptually showing a bending process for a bent part 11 according to the first embodiment of the present invention.

DESCRIPTION OF THE PREFERRED EMBODIMENTS

Hereinafter, embodiments according to the present invention shall be described with reference to the drawings. However, the present invention is not limited to the embodiments below.

First Embodiment

Figure 1:
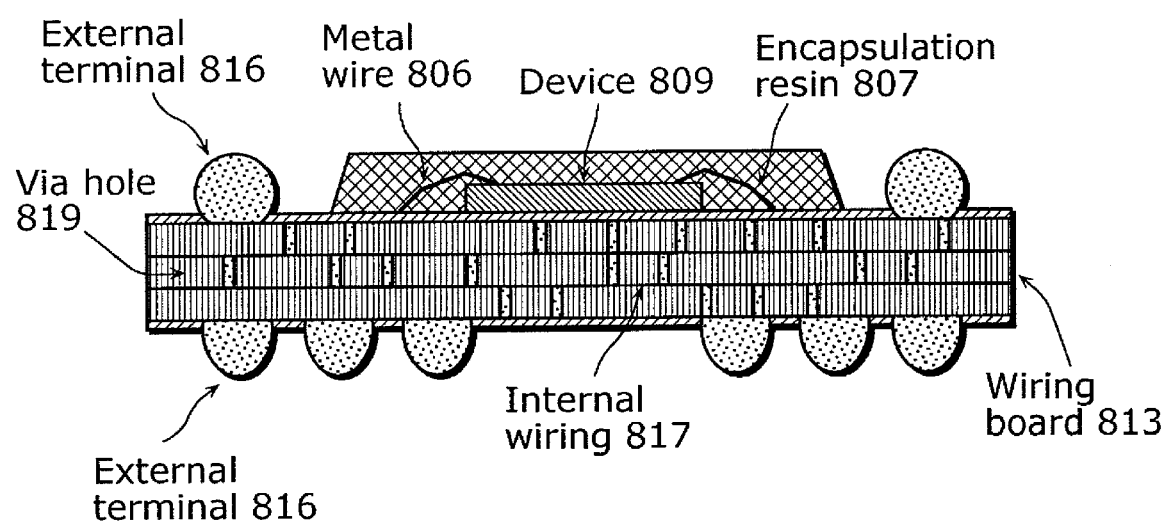
FIG. 1 is a cross-sectional view of a conventional package using a multilayer wiring board on which devices are stacked.
Figure 2A:
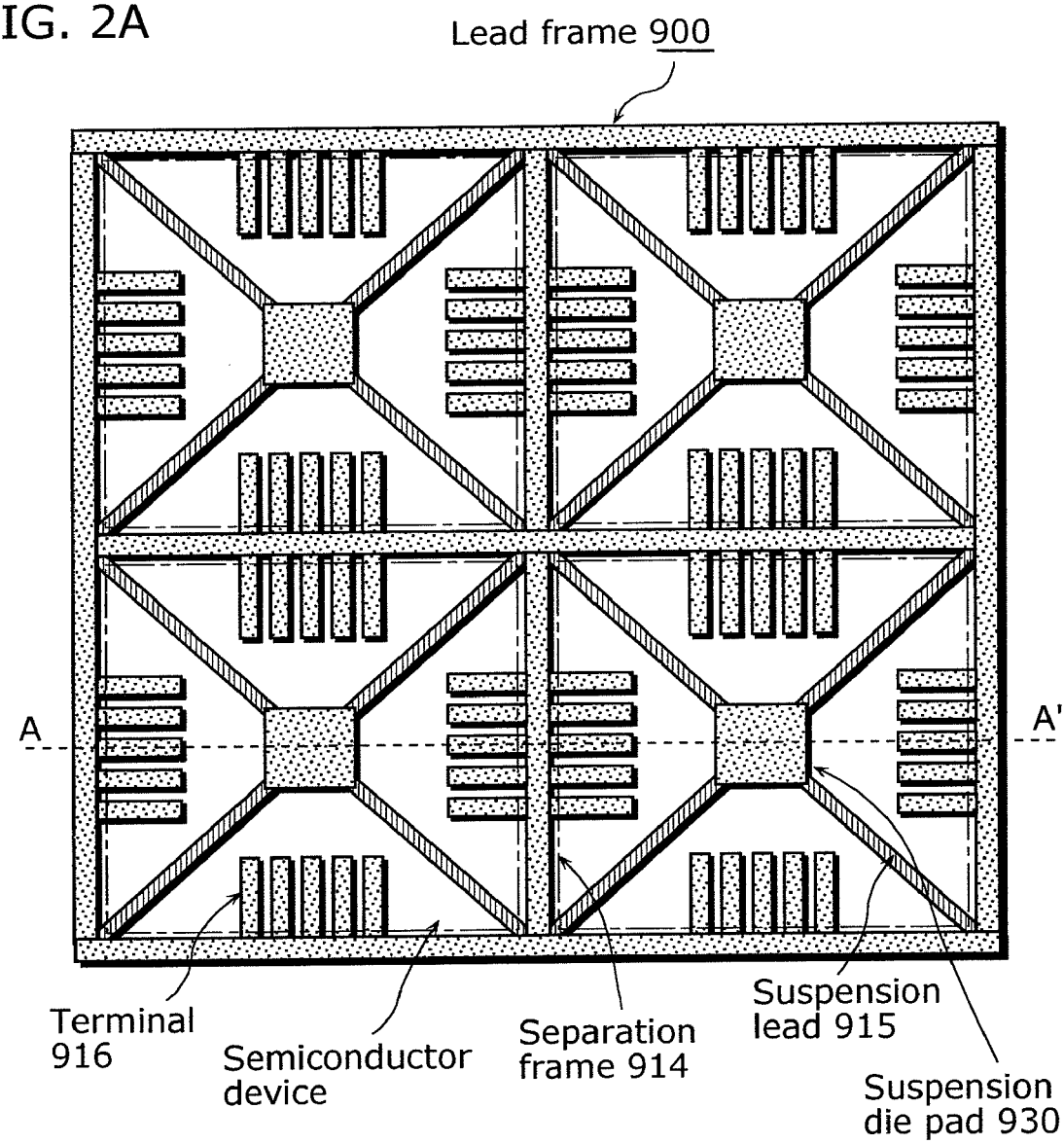
FIGS. 2A and 2B are diagrams showing a common lead frame used for a QFN for conventional collective encapsulation molding.
Figure 2B:
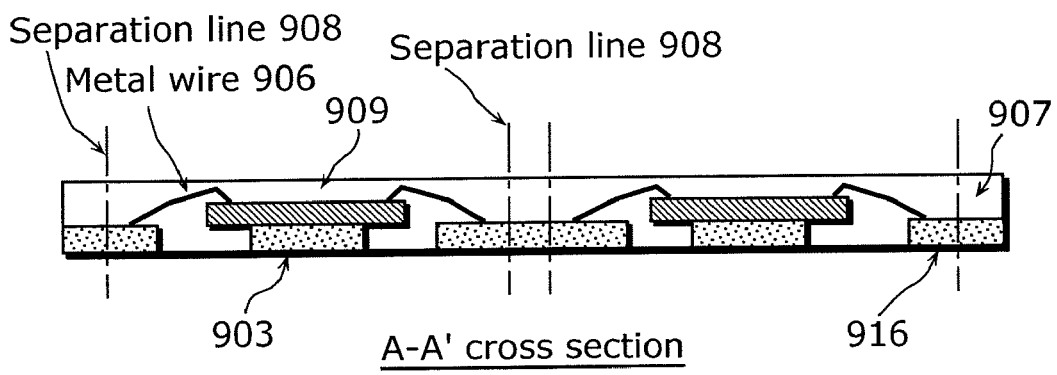
Figure 3A:
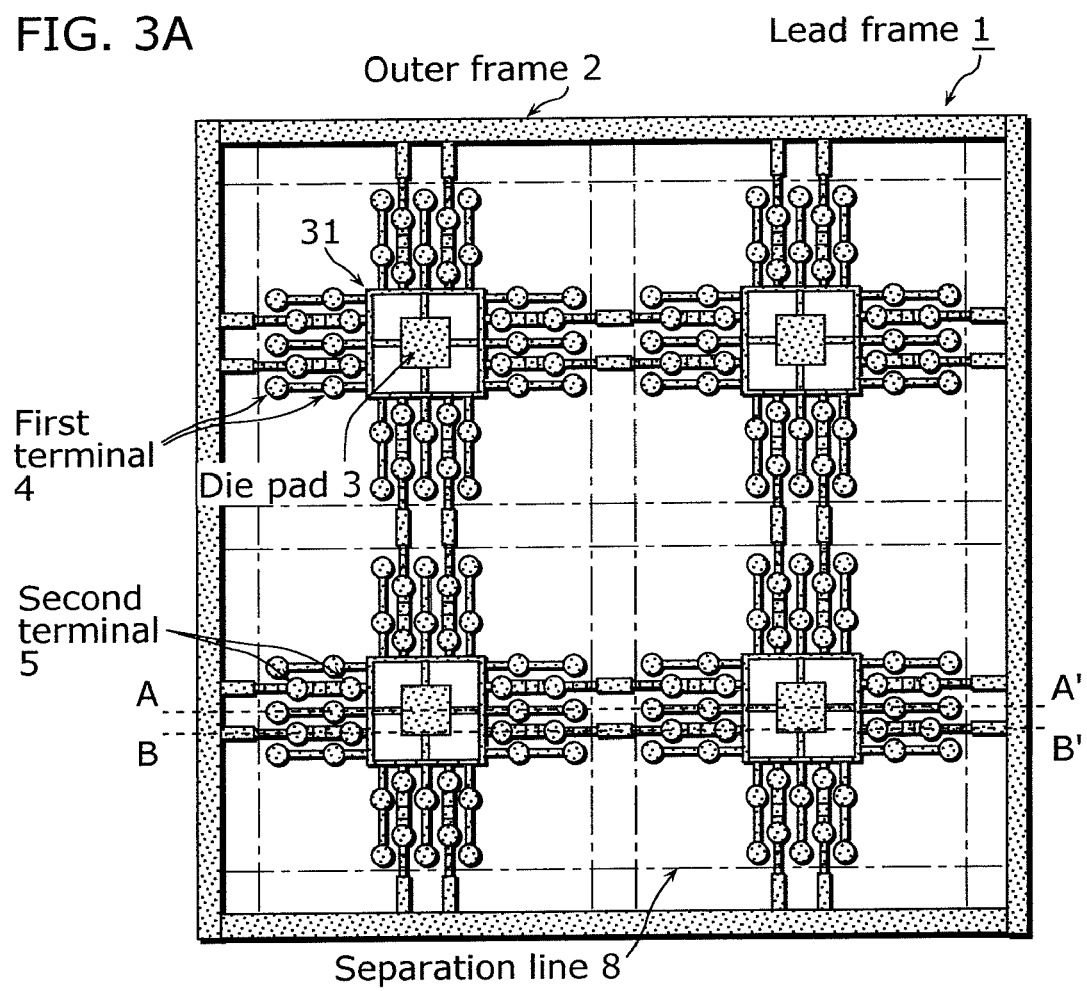
FIGS. 3A to 3C are diagrams showing an unfinished lead frame according to a first embodiment of the present invention.
Figure 3B:
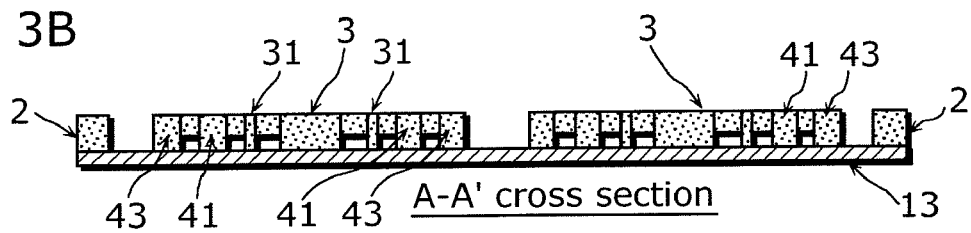
Figure 3C:
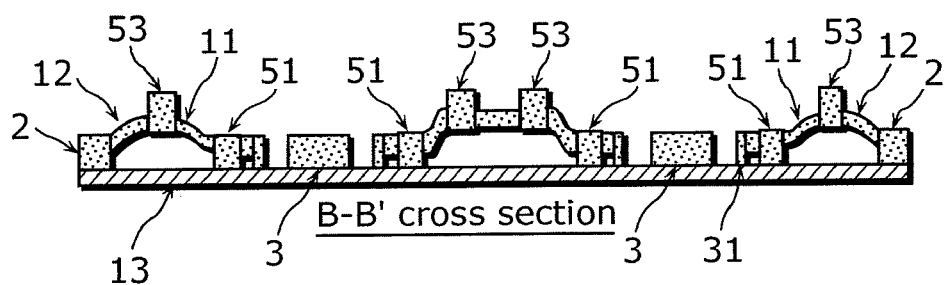

FIGS. 3A to 3C are diagrams showing an unfinished lead frame according to a first embodiment of the present invention.

FIG. 3A is a plan view of a lead frame 1 connected with unfinished terminals. FIG. 3B is a cross-sectional view of the lead frame 1 at A-A' of FIG. 3A. FIG. 3C is a cross-sectional view of the lead frame 1 at B-B' of FIG. 3A.

As FIG. 3A shows, the lead frame 1 includes: an outer frame 2, a die pad 3, first terminals 4, and second terminals 5. A tape 13 for holding the lead frame 1 is attached to the lower surface of the lead frame 1.

The outer frame 2 is a frame made of metal and formed along the outermost circumference of the lead frame 1.

Inside the outer frame 2, a plurality of electronic component regions 21 are formed. Here, four electronic component regions 21 are formed adjoining each other in an array of 2 rows and 2 columns. At the center of each of the electronic component regions 21, the die pad 3 is formed, with an auxiliary bar 31 in the shape of a frame surrounding the circumference of the die pad 3. Around the auxiliary bar 31 are provided first terminals 4 and second terminals 5 connected to the auxiliary bar 31. Here, the electronic component regions 21 adjoining each other within the outer frame 2 are connected, for example, by connection parts through the second terminals 5.

Note that it is assumed above that the electric component regions 21 are formed adjoining each other in an array of 2 rows and 2 columns, but it goes without saying that any combination is applicable as long as they are formed in: M rows and N columns, and M, N=2 or more. In addition, the electronic component regions 21 adjoining each other may be connected, for example, by connection parts through the first terminals 4.

For each of the electronic component regions 21 within the outer frame 2, the first terminals 4 are formed around the auxiliary bar 31 surrounding the circumference of the die pad 3. The lower surfaces of the first terminals 4 serve as external terminals after packaging. The first terminals 4, as represented by circles in FIG. 3A, are formed in a plurality of lines with respect to each of the electronic component regions 21, between the auxiliary bar 31 and a boundary of the electronic component regions 21. In addition, each line includes two first terminals 4, which are formed connected to each other.

Here, a first terminal 4 located at the inner side of each line, that is, the one located closer to the die pad 3 is referred to as a first inner terminal 41, and a first terminal 4 located at the outer side of each line, that is, the one located closer to the boundary of electronic component regions 21 is referred to as a first outer terminal 43.

Note that the two first terminals 4 in each line, that is, the first inner terminal 41 and the first outer terminal 43 become separated in a subsequent process, with each connection part between the first inner terminal 41 and the first outer terminal 43 being cut off with a punch or the like.

In addition, the first outer terminal 43 is not connected to the outer frame 2, and therefore is electrically independent.

The second terminals 5 are formed around the auxiliary bar 31 surrounding the circumference of the die pad 3, with respect to each of the electronic component regions 21 within the outer frame 2. As with the first terminals 4, the second terminals 5 as represented by circles in FIG. 3A are formed in a plurality of lines with respect to each of the electronic component regions 21, between the auxiliary bar 31 and a boundary of the electronic component regions 21. In addition, each line includes two second terminals 5 which are formed connected to each other.

Here, a second terminal 5 located at the inner side of each line, that is, the one located closer to the die pad 3 is referred to as a second inner terminal 51, and a second terminal 5 located at the outer side of each line, that is, the one located closer to the boundary of the electronic component regions 21 is referred to as a second outer terminal 53. In addition, the part connecting the second inner terminal 51 and the second outer terminal 53 is referred to as a bent part 11.

In addition, the outer frame 2 and the second outer terminal 53 are connected through a joint part 12. Note that as described earlier, the adjoining electronic component regions 21 are connected by a connection part that mediates the second outer terminal 53.

In addition, the second inner terminal 51 is mainly used for internal connection, and the second outer terminal 53 is used as an external terminal after packaging.

With each line, bending processing is performed on the bent part 11 that connects the second inner terminal 51 and the second outer terminal 53, and on the joint part 12 that connects the second outer terminal 53 and the outer frame 2. Through the bent part 11 and the joint part 12 that are bending-processed, the second outer terminal 53 that serves as an external terminal after packaging is secured at a higher position than the upper surface of the die pad 3.

In addition, bending processing is performed on the connection part that connects, through the second outer terminal 53, the electronic component regions 21 adjoining each other within the outer frame 2. Through the connection part and the bent part 11 that are bending-processed, the second outer terminal 53 located closer to the a separation line 8 and serving as an external terminal after packaging is secured at a higher position than the upper surface of the die pad 3. Here, the position of the second inner terminal 51 is not changed due to the bent part 11 that is bending-processed, and is secured at nearly the same height as the first terminals 4. In addition, the height of the second outer terminal 53 is arbitrarily adjusted according to the degree of the bending performed on the bent part 11. For example, the height of the second outer terminal 53 is adjusted, through the bent part 11 that is bending-processed, to the level at which the second outer terminal 53 is exposed on the surface of the package after packaging.

FIG. 3B is a cross-sectional view at A-A' of FIG. 3A, showing a cross section of the first terminals 4. FIG. 3C is a cross-sectional view at B-B' of FIG. 3A, showing a cross section of the second terminals 5.

As seen from FIG. 3B, a portion corresponding to the separation line 8 in FIG. 3A, that is, the portion closer to the boundary of the electronic component regions 21 adjoining each other, is a portion including "no" metal. The fact that no metal is formed in the separation line 8 is to prove highly effective in a subsequent assembly process since no stress is given onto the dicing blade 81 used for cutting off to separate the adjoining electronic component regions 21, and that, without occurrence of metal burrs after the cut.

In addition, as FIG. 3C shows, the second outer terminal 53 located closer to the boundary of electronic component regions 21 or the outer frame 2, that is, the one located closer to the separation line 8 is in the state of being suspended in the air. The upper surface of the second outer terminal 53 is at a higher level than the upper surface of the die pad 3, and thus the lower surface of the second outer terminal 53 has no contact underneath.

In addition, the lower surface of the lead frame 1, that is, the lower surfaces of the outer frame 2, the die pad 3, the first terminals 4, and the second inner terminal 51 are held and secured onto the tape 13. Thus, the lower surface of the lead frame 1 is solidly supported by the tape 13, thereby ensuring stable transportation and assembly in the subsequent transportation process despite the fact that the second outer terminal 53 is suspended in the air.

Here, the tape 13, although not shown in the figure, is made up of a tape base material and an adhesion layer on the surface of the tape base material. The tape 13 adheres, through the adhesion layer, to the lower surface of the lead frame 1. In addition, the base material of the tape 13 is made of a material having heat resistance (specifically, 150° C. to 230° C.) that is sufficient for resisting the heat history of the assembly process, and is made of epoxy resin, polyimide resin, and the like.

Note that on the surface of the lead frame 1, for example, a trilaminar plated layer is formed that is made up of a nickel (Ni) plated layer, a palladium (Pd) plated layer, and a gold (Au) flash plated layer.

In addition, the die pad 3, the first terminals 4, and the second inner terminal 51 may be Ag plated, for example, and solder plating such as tin-silver (Sn—Ag) and tin-bismuth (Sn—Bi) may be partially applied to the second outer terminal 53 that serves as an external terminal.

In addition, it is preferable that the thickness of plating be, for example, 0.2 µm or less for Au flash plating, 1 µm or less for Pd plating, and a few µm for Ag plating. For example, it is preferable that the thickness of the lead frame 1 be, for example, 50 µm to 200 µm.

FIG. 4 is a diagram conceptually showing the bending process for the bent part 11. FIG. 4(a) is the same as B-B' of FIG. 3(c). In FIG. 4(a), a portion specifically referred to as Portion A includes: the second outer terminal 53; the second inner terminal 51; the bent part 11 connecting the second outer terminal 53 and the second inner terminal 51; and the joint part 12 connecting the second outer terminal 53 and the outer frame 2. FIG. 4(b) shows the status of Portion A including the bent part before bending, and FIG. 4(b) shows the status of Portion A including the bent part 11 after bending.

In the status shown in FIG. 4(a), the bent part 11 connecting the second outer terminal 53 and the second inner terminal 51, and the joint part 12 connecting the second outer terminal 53 and the outer frame 2 are thinned (hereinafter, referred to as thin-walled) to facilitate the bending process. Specifically, as shown in FIG. 4(a), the bent part 11 is connected to the lower portion of the second outer terminal 53 that serves as an external terminal after packaging. In addition, the bent part 11 is connected to the upper portion of the second inner terminal 51. The joint part 12 is connected to the lower portion of the second outer terminal 53 that serves as an external terminal after packaging. In addition, the joint part 12 is connected to the upper portion of the outer frame 2.

Note that the bent part 11 is thin-walled so as to be thinner than the second outer terminal 53 and the second inner terminal 51, thereby having half or less than half the thickness of the second outer terminal 53 and the second inner terminal 51. The joint part 12 is thin-walled so as to be thinner than the second outer terminal 53 and the outer frame 2, thereby having half or less than half the thickness of the second outer terminal 53 and the outer frame 2. By thus designing, the upper surface of the second outer terminal 53 that serves as an external terminal can be thoroughly exposed when sealed with the encapsulation resin in the subsequent assembly process.

FIG. 4(b) shows the status of the bent part 11 and the joint part 12 after bending.

In the bending process proceeding from the status of FIG. 4(a) to the status of FIG. 4(b), the bent part 11 and the joint part 12 are processed comparatively easily since they are thin-walled as described earlier.

Here, the thickness of the lead frame 1 after bending is designed according to a thickness that is to be the thickness of the electronic component after resin encapsulation. In other words, the degree of bending for the bent part 11 and the joint part 12 is adjusted according to the thickness of the electronic component after resin encapsulation. Here, assuming, for example, that the thickness of the original metal plate before the formation of the lead frame 1 is 200 µm, the degree of bending is adjusted so that the thickness of the lead frame 1 after the bending is within a range of 1- to 3-fold, that is, within the thickness ranging from 200 µm to 600 µm. In other words, this allows flexible positioning of the upper and lower external terminals in design such that the thickness of the electronic component after resin encapsulation is between 200 µm and 600 µm.

Figure 5A:
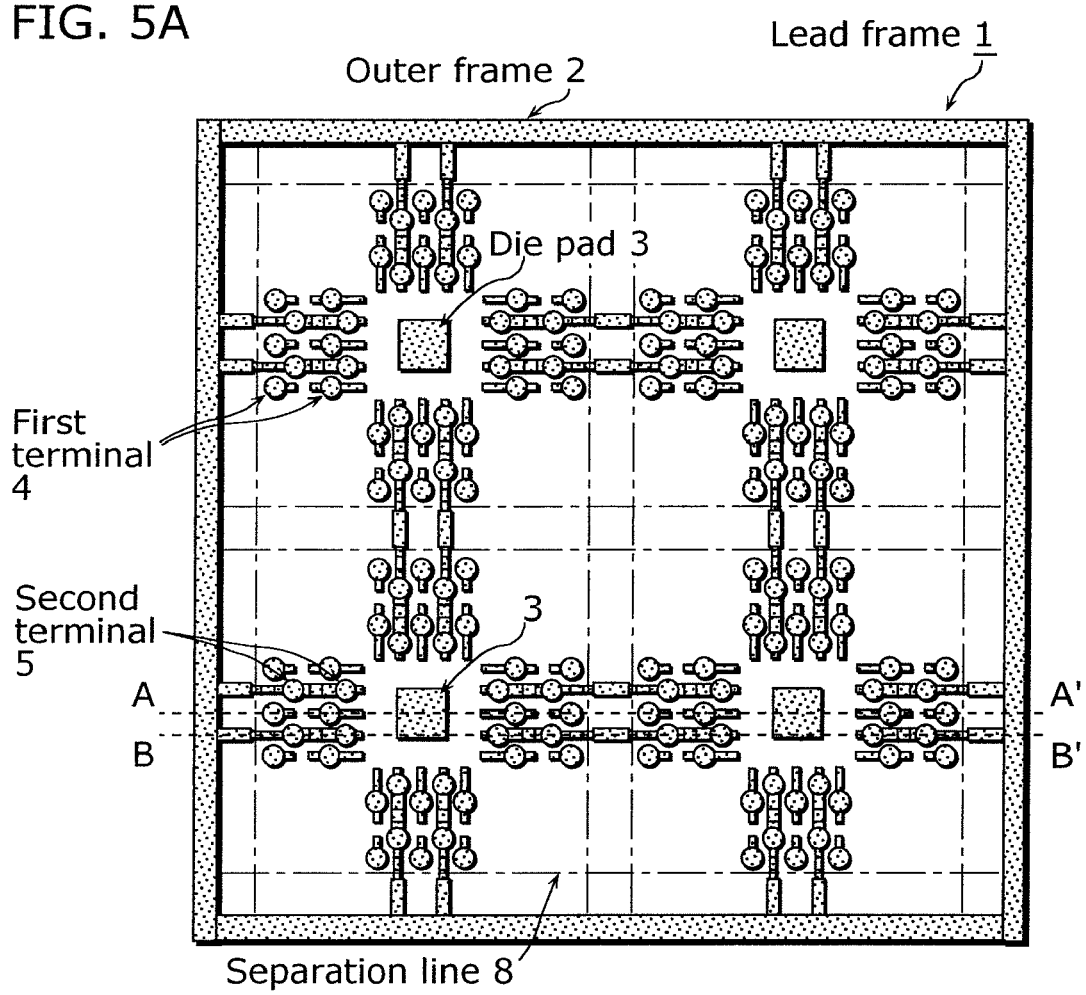
FIGS. 5A to 5C are diagrams showing a finished lead frame 1 before an assembly process, according to the first embodiment of the present invention.
Figure 5B:
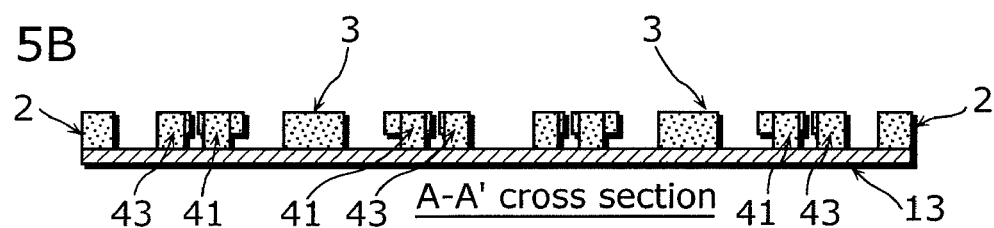
Figure 5C:
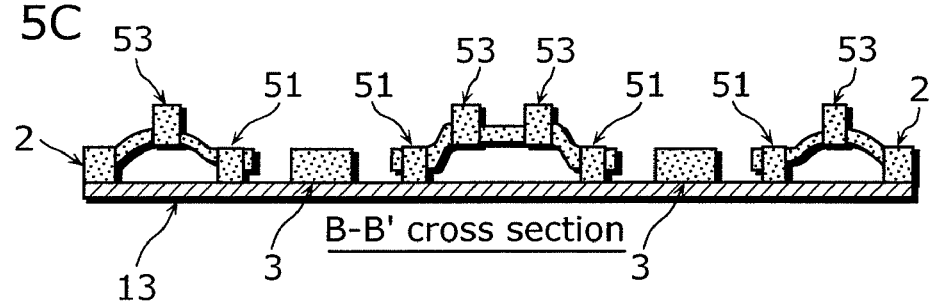

FIGS. 5A to 5C are diagrams showing a finished lead frame 1 before the assembly process, according to the first embodiment of the present invention. FIG. 5A is a plan view of the lead frame 1 before the assembly process, which is not yet assembled into an electronic component. FIG. 5B is a cross-sectional view of the lead frame 1 at A-A' of FIG. 5A. FIG. 5C is a cross-sectional view of the lead frame 1 at B-B' of FIG. 5A. In FIGS. 5A to 5C, the auxiliary bar 31 shown in FIGS. 3A to 3C is removed. In addition, in FIGS. 5A to 5C, the part connecting the first inner terminal 41 and the first outer terminal 43 is removed, and thereby the first inner terminal 41 and the first outer terminal 43 are electrically independent.

The process leading to FIGS. 5A to 5C is as follows.

First, bending is performed on the bent part 11 and the joint part 12.

Next, the lower surface of the lead frame 1, that is, the lower surfaces of the outer frame 2, the die pad 3, and the first terminals 4, and the second inner terminal 51 are held and secured onto the tape 13 (FIGS. 3A to 3C).

Next, the auxiliary bar 31 and the part connecting the first inner terminal 41 and the first outer terminal 43 are removed so that the terminals are separate as shown in FIGS. 5A to 5C.

Note that the auxiliary bar 31 may be utilized, instead of being removed, as a power source ring while being connected to a part of the terminals included in the lead frame 1. In this case, it is sufficient that the auxiliary bar 31 is connected to one or more given terminals in the lead frame 1, and subsequently is electrically connected to the metal wire 6 of the device 9 or to an electrode in the backside (the side connected to the die pad 3) of the device 9.

In addition, as seen from FIG. 5B, the portion corresponding to the separation line 8 in FIG. 5A, that is, the portion near the boundary of the adjoining electronic component regions 21, is a portion including "no" metal. In addition, as FIG. 5C shows, the second outer terminal 53 located closer to the boundary of electronic component regions 21 or the outer frame 2, that is, the one located closer to the separation line 8 is in the state of being suspended in the air. The upper surface of the second outer terminal 53 is at a higher level than the upper surface of the die pad 3, and thus the lower surface of the second outer terminal 53 has no contact underneath.

Figure 6:
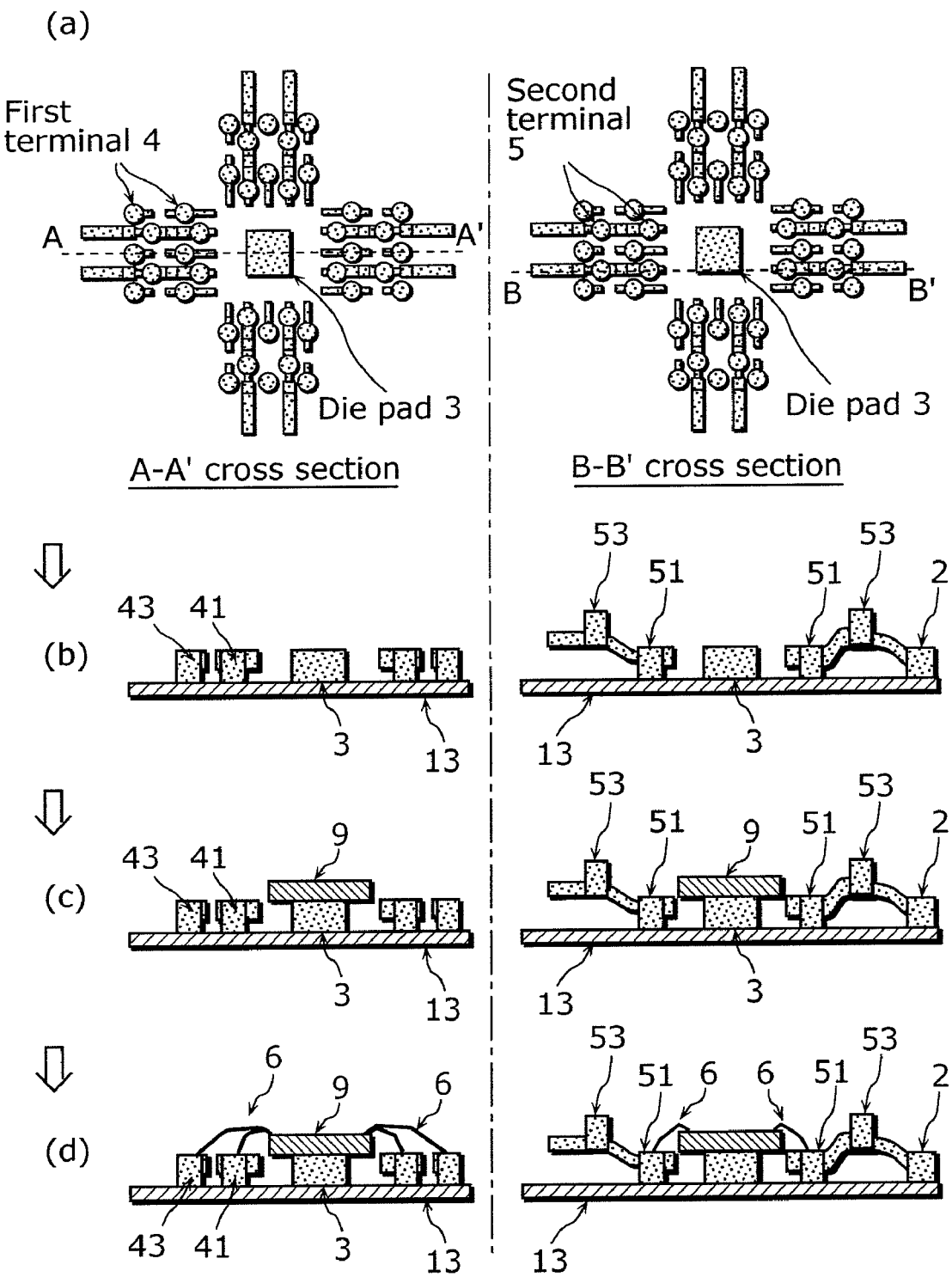
FIG. 6 is a diagram for describing the assembly process in which electronic components are assembled using the lead frame according to the first embodiment of the present invention.
Figure 7:
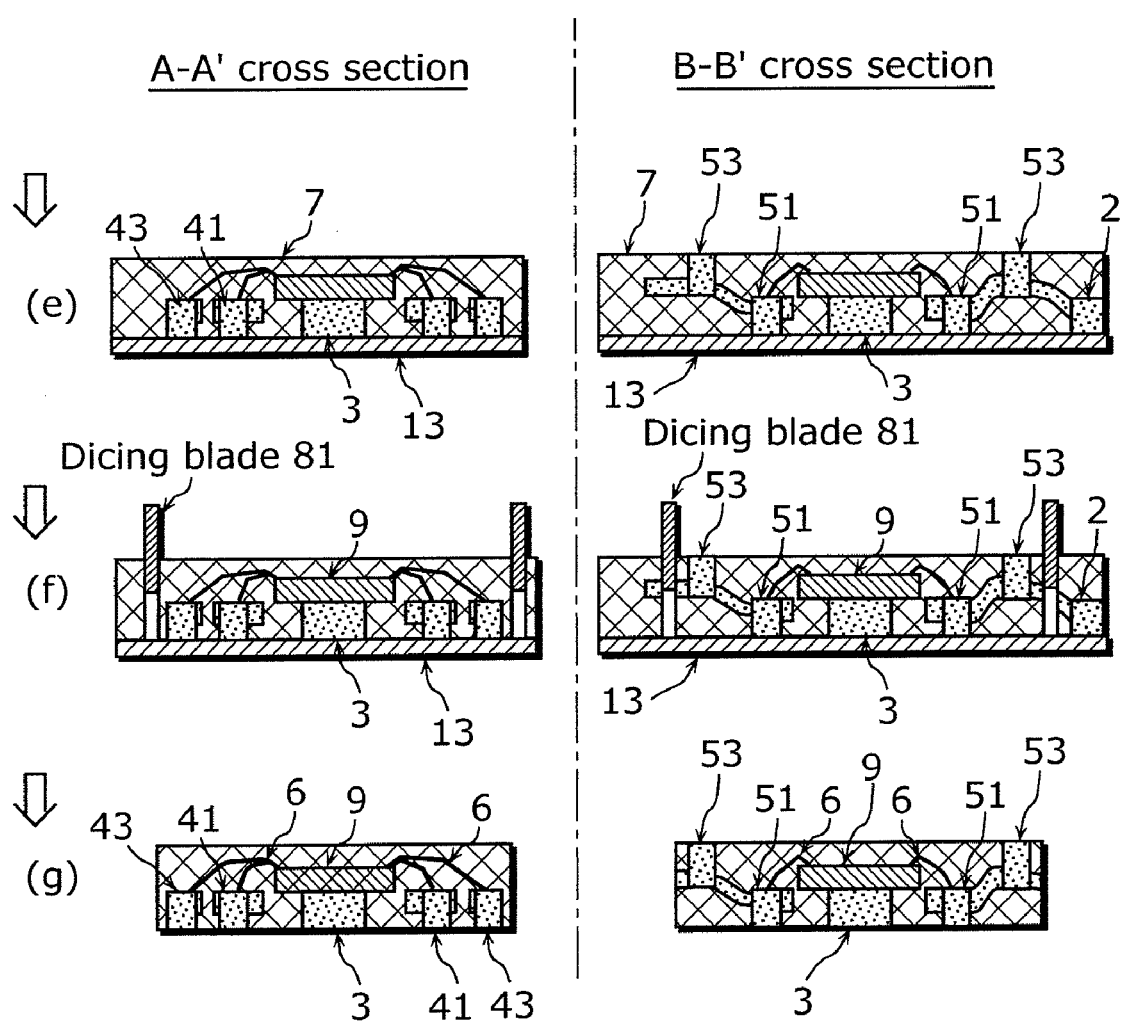
FIG. 7 is a diagram for describing the assembly process in which electronic components are assembled using the lead frame according to the first embodiment of the present invention.

FIGS. 6 and 7 are diagrams for describing the assembly process for assembling the electronic component using the lead frame according to the first embodiment of the present invention. In FIGS. 6 and 7, the assembly process of the first terminals 4 is shown on the left side, and the assembly process of the second terminals 5 is shown on the right side.

FIG. 6(a) is a plan view showing the lead frame 1 in the electronic component region 21 shown in FIG. 5.

FIGS. 6(b) to 6(d) and FIGS. 7(e) to 7(g) are cross-sectional views at A-A' and B-B', showing the assembly processes of the first terminals 4 and the second terminals 5.

As described earlier with FIGS. 5A to 5C, FIG. 6(b) shows the status in which the lead frame 1, after completion of the bending process and the separation of terminals, is secured onto the tape 13.

Next, in the process shown in FIG. 6(c), the device 9 is mounted onto the die pad 3 and firmly fixed. The device 9 and the die pad 3 are firmly fixed, using a Die Attach Film (DAF), an Ag paste, an epoxy-type insulating adhesive, a silicone adhesive, an Au—Si eutectic, a solder, and so on.

Here, the DAF refers to a special self-adhesive film used for mounting and layering devices. In addition, the device 9 is an active device, a passive device, a semiconductor device, Micro Electro Mechanical Systems (MEMS), a battery, and the like, and here, a semiconductor chip, for example. In addition, the thickness of the device 9 ranges from 30 µm to 150 µm, and specifically from 50 µm to 100 µm in the case of the semiconductor device.

Next, in the process of FIG. 6(d), the device 9 and the terminals of the lead frame 1 are internally connected to each other. That is, the metal wire 6 electrically connects: the electrode section of the device 9 (not shown), the upper surfaces of the first terminals 4, and the upper surface of the second inner terminal 51.

Here, the metal wire 6 is made of Al, Au, Cu, or the like. The metal wire 6, when made of Au, is ball-bonded by ultrasonic thermocompression bonding, using a wire having a diameter ranging from φ18 µm to φ30 µm. The metal wire 6, when made of Al, is wedge-bonded by ultrasonic bonding at normal temperature, using a wire having a diameter raging from φ30 µm to φ100 µm. When the metal wire 6 is made of Cu, a Cu wire coated in an oxidation-reduction atmosphere is used. Note that the device 9 and the terminals of the lead frame 1 may be electrically connected to each other, using an Al or a Cu ribbon in place of the metal wire 6, in order to internally connect the device 9 and the terminals of the lead frame 1.

Next, in the process of FIG. 7(e), the lead frame 1, the device 9, and the metal wire 6 are sealed with the encapsulation resin 7. The lower surfaces of the first terminals 4 and the upper surface of the second outer terminal 53 that serve as external terminals are resin-encapsulated so that that they are exposed on the surface of the encapsulation resin 7.

Here, the bent part 11 is kept from being exposed on the surface of the encapsulation resin 7, through adjustments of the degree of bending or the degree of thin-walling to be processed onto the bent part 11.

Here, the lower surface of the die pad 3 may be exposed where appropriate. In addition, the opposed surface of the region in which the metal wire 6 is connected to one of the second terminals 5, that is, the lower surface of the second inner terminal 51 is exposed on the surface of the encapsulation resin 7; however, it is possible to seal an unnecessary terminal with the encapsulation resin 7, by thin-walling the lower surface of the second inner terminal 51 and then encapsulating the lower surface of the second inner terminal 51 with resin.

Generally, the Land Grid Array (LGA) often includes circular terminals. Therefore, it is assumed that the upper and lower surfaces of the terminals of the lead frame 1, that is, the first terminals 4 and the second terminals 5 are circular in shape. The first terminals 4 and the second terminals 5 that do not serve as external terminals are thin-walled, through processing such as etching and coining, in such a manner that provides a recessed portion on the surface in the thickness direction of the first terminals 4 and the second terminals 5 that do not serve as external terminals, and then sealed with the encapsulation resin 7. Therefore, in the electronic component (semiconductor device) after resin encapsulation, the terminals are only visible from the outside as circles on the upper or lower surfaces of the first terminals 4 and the second terminals 5. In addition, such circular shaping of the upper and lower surfaces of the first terminals 4 and the second terminals 5 allows increase of the area of the upper and lower surfaces. Therefore, such shaping is advantageous in stabilizing the connection by the metal wire 6, of the device 9 and the terminals of the lead frame 1 that are to be internally connected, and also produces an effect of improved strength of the mounting onto the upper or the lower surfaces of the first terminals 4 and the second terminals 5 that serve as external terminals since larger area can be secured for solder connections for mounting.

Next, in the process of FIG. 7(f), the encapsulant over the lead frame 1, the device 9, and the metal wire 6 that have been collectively sealed with the encapsulation resin 7 in the preceding process is divided into individual electronic components with respect to each electronic component region 21. Generally, the encapsulant is cut off, using a dicing blade 81 made of diamond particles hardened with bond. In the present invention, as described earlier, no band-shaped separation frame is provided on the separation line 8 that is to be divided by the dicing blade 81. In other words, as FIG. 7(f) shows, no "metal part" (only resin) is present on the separation line for the first terminals 4, thereby dramatically reducing the breakage or the wear of the dicing blade 81.

Note that for dividing the encapsulant, such a cutting method using the dicing blade 81 may not necessarily be adopted. For example, another effective option when the thickness of the electronic component is 200 μm or less is to use a laser (YAG, CO2) for cutting off the encapsulant to separate the electronic component regions 21 into individual electronic components.

In addition, the connection part that connects, through the second outer terminal 53, the adjoining electronic component regions 21 within the outer frame 2 and the joint part 12 that connects the second outer terminal 53 and the outer frame 2 are cut off by the dicing blade 81. The residual of the connection part and the joint part 12, which remains on the second outer terminal 53 after being cut by the dicing blade 81, is exposed on a lateral surface of the electronic component. However, such a residual of the connection part and the joint part 12, remaining on the second outer terminal 53, does not undermine the level of perfection for the electronic component in which the height of the second outer terminal 53 is flexibly changed. This is because resin cracks and metal burrs are kept from reaching the upper and lower surfaces of the electronic component due to the sandwich effect produced by retaining the encapsulation resin 7 on the upper and lower surfaces of the residual of the connection part and the joint part 12 that remains on the second outer terminal 53, through exposure of the residual in the vicinity of the center of the lateral surface of the electronic component.

Next, in the process of FIG. 7(g), the tape 13 is removed from the electronic components in each electronic component region 21, that is, the lead frame 1, the device 9, and the metal wire 6 included in each electronic component region 21, which have been separated by the dicing blade 81 as an individual electronic component and sealed with the encapsulation resin 7.

Figure 8A:
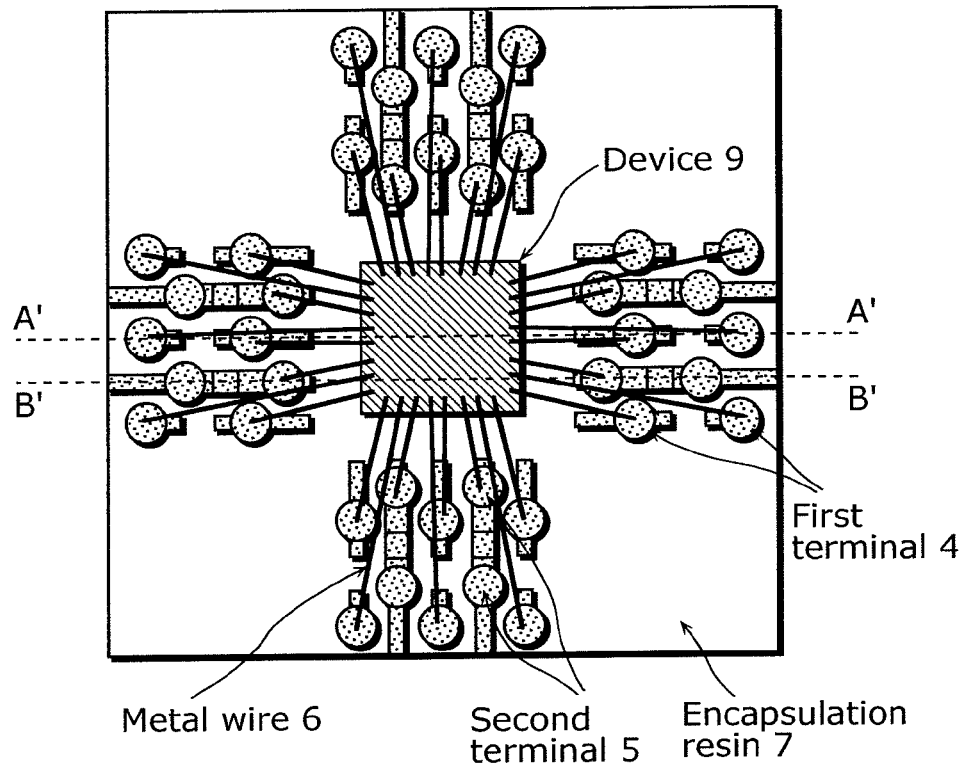
FIGS. 8A to 8C are diagrams showing a finished electronic component after the assembly process, according to the first embodiment of the present invention.
Figure 8B:
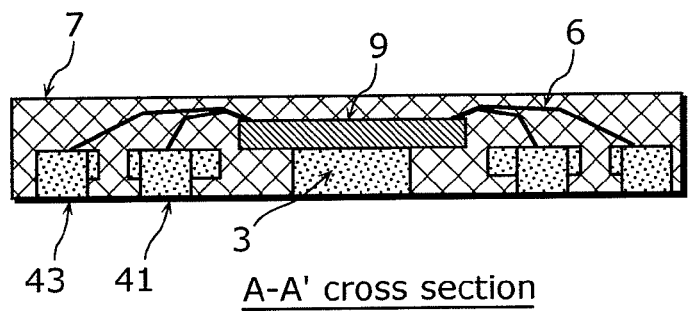
Figure 8C:
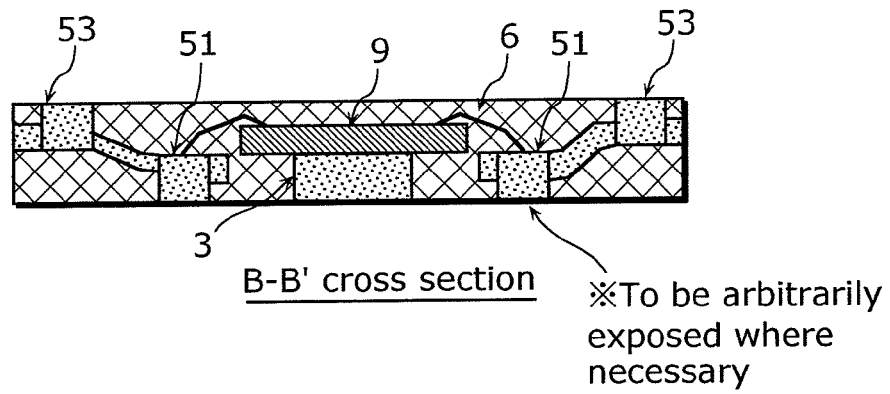

Here, a thermoset ultraviolet (UV) cure adhesive material, for example, is used for the adhesion layer of the tape 13. Ultraviolet radiation can weaken the adhesive power of such thermoset UV cure adhesive material, thereby facilitating removal of the tape 13 from the electronic component. FIGS. 8A to 8C are diagrams showing a finished electronic component after the assembly process, according to the first embodiment of the present invention. FIG. 8A is a plan view of the finished electronic component after the assembly process, assuming the encapsulation resin 7 as transparent. FIG. 8B is a cross-sectional view at A-A' of the finished electronic component after the assembly process shown in FIG. 8A. FIG. 8C is a cross-sectional view at B-B' of the finished electronic component after the assembly process shown in FIG. 8A. FIG. 8B shows a characteristic point. More specifically, no burrs resulting from the cutting of the metal are observed on the external side surfaces of the first outer terminal 43, that is, on the lateral surfaces of the electronic component. This is because the lead frame 1 is designed, in its structural phase, such that the electronic component regions 21 adjoining each other are not connected through the first terminals 4.

Figure 9A:
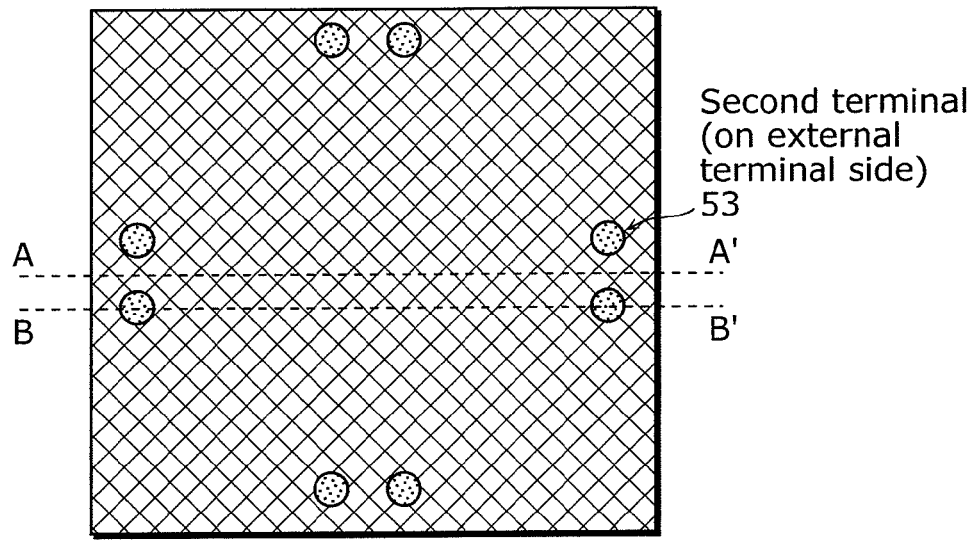
FIGS. 9A to 9D are external views of a finished electronic component after the assembly process, according to the first embodiment of the present invention.
Figure 9B:
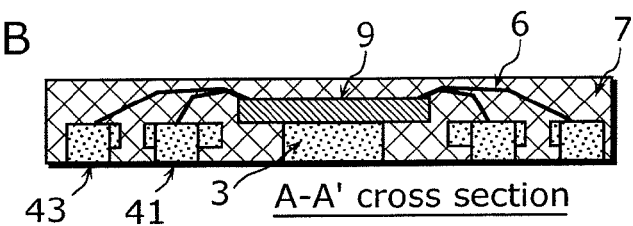
Figure 9C:
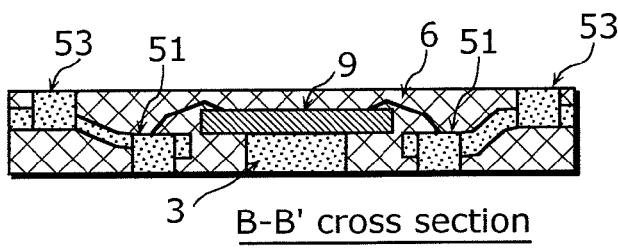
Figure 9D:
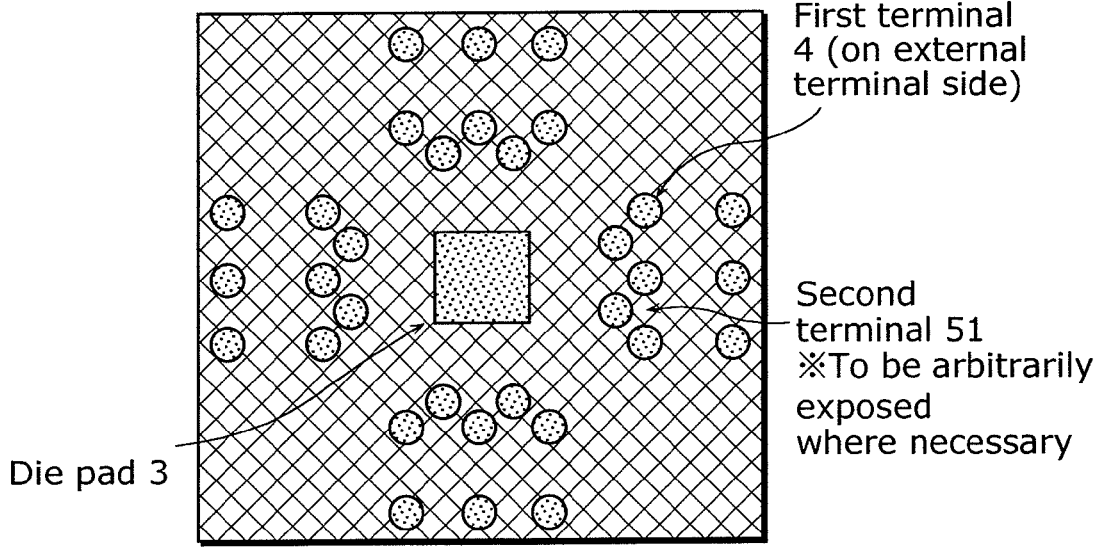

FIGS. 9A to 9D are external views of a finished electronic component after the assembly process, according to the first embodiment of the present invention. FIG. 9A is an external view from above of the finished electronic component after the assembly process. FIG. 9B is a cross-sectional view at A-A' of the finished electronic component after the assembly process shown in FIG. 9A. FIG. 9C is a cross-sectional view at B-B' of the finished electronic component after the assembly process shown in FIG. 9A. FIG. 9D is an external view from below of the finished electronic component after the assembly process.

As seen from the external views of FIGS. 9A and 9D and the cross-sectional views of FIGS. 9B and 9C, a portion exposed on the both sides of the electronic components is the portion designed to be external terminals, that is, only the lower surfaces of the first terminals 4 and the upper surface of the second outer terminal 53.

Note that the number and the structure of the upper and lower terminals can be designed and modified according to the application.

In addition, the lower surface of the second inner terminal 51 may be designed to serve as an external terminal that is exposed on the backside of the electronic component.

As described thus far, according to the first embodiment of the present invention, it is possible to readily adjust the height of the second outer terminal 53 that serves as an external terminal, by including the bent part 11 and the joint part 12 and performing bending processing onto the bent part 11 and the joint part 12. This allows realization of the lead frame 1 including upper and lower external terminals using a single piece of lead frame, without using a wiring board. In addition, with such flexibility in designing the position and the area size of the second outer terminal 53 that is to be an external terminal, it is possible to ensure the diversity of designs. That is, the manufacturing is easy. In addition, since no separation frame is provided at the boundary of the electronic component regions 21, it is possible to reduce the stress onto the dicing blade 81 resulting from the cutting of the lead frame 1 with respect to each electronic component region 21, thereby making the life of the dicing blade 81 longer. In addition, since no separation frame is provided at the boundary of the electronic component regions 21, it is possible to significantly reduce the number of cut surfaces in the metal cut off by the dicing blade 81 as compared to the conventional lead frame including a separation frame, thereby preventing contact failure caused by metal burrs in the electronic component including the lead frame 1.

This makes it possible to realize a lead frame that allows easy manufacturing and cost reduction while preventing decreases in reliability.

Note that in the first embodiment of the present invention, the first terminals 4 and the second terminals 5 are alternately arranged, but the present invention is not limited to this. The present invention is also applicable when, for example, the positions of the first terminals 4 and the second terminals 5 have a consecutive or a skipping positional relationship.

In addition, the flexibility in designing the position and the area size of the second outer terminal 53 that serves as an external terminal allows securing sufficient area for the second outer terminal 53 that serves as the external terminal. This improves and stabilizes the connection reliability for the electrodes of the electronic component that are to be stacked onto the upper surface and the superior portion of the upper surface of the second outer terminal 53 that serves as an external terminal.

Second Embodiment

Figure 10A:
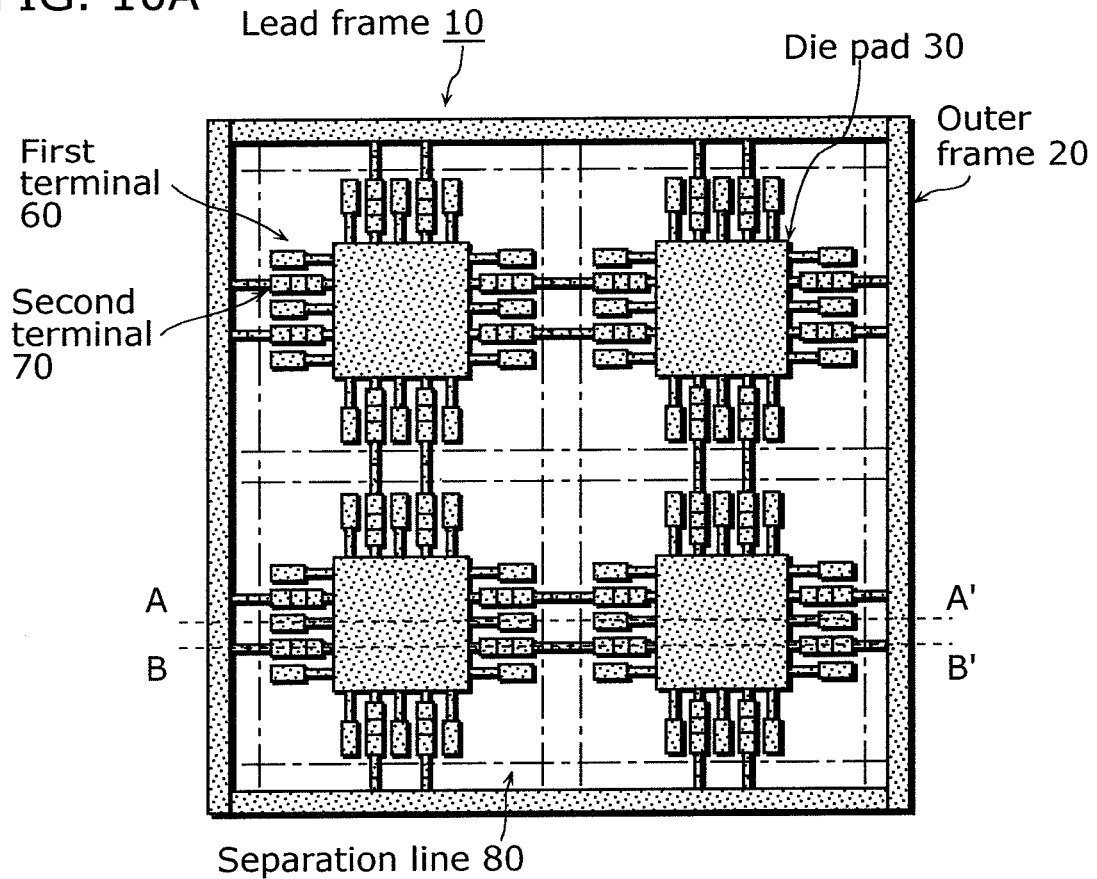
FIGS. 10A to 10C are diagrams showing an unfinished lead frame according to a second embodiment of the present invention.
Figure 10B:
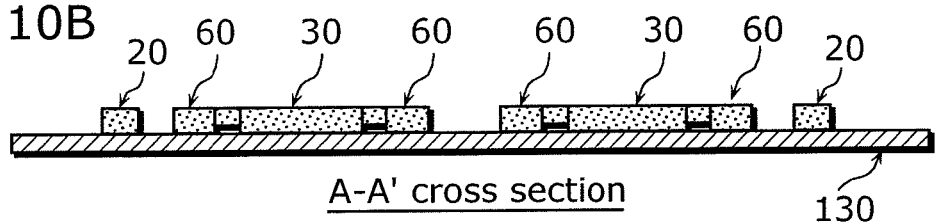
Figure 10C:
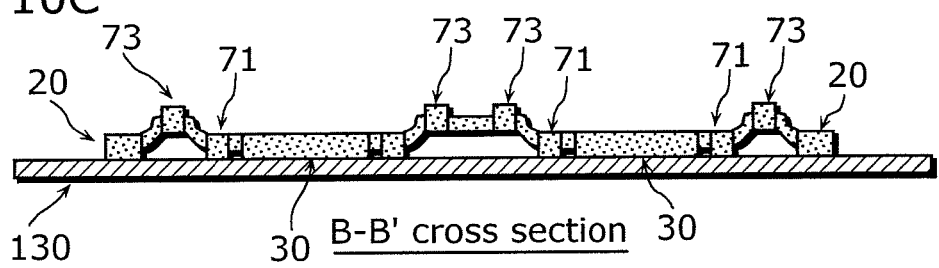

FIGS. 10A to 10C are diagrams showing an unfinished lead frame according to a second embodiment of the present invention. FIG. 10A is a plan view of the lead frame 10 connected with unfinished terminals. FIG. 10B is a cross-sectional view of the lead frame 10 at A-A' in FIG. 10A. FIG. 10C is a cross-sectional view of the lead frame 10 at B-B' in FIG. 10A. The first embodiment of the present invention is a preferred embodiment for packages intended for multi-serial terminals (20 to 200 pins), such as what are known as Land Grid Array (LGA) and Ball Grid Array (BGA); whereas the second embodiment is a preferred embodiment for packages intended for small pins (2 to 60 pins), such as Small Outline Non-leaded Package (SON) and Quad Flat Non-leaded Package (QFN). In the lead frame 1 according to the first embodiment, the first terminals 4 and the second terminals 5 are in contact with the auxiliary bar 31; whereas, the number of terminals is comparatively small in the present second embodiment, and therefore in the lead frame 10, as FIGS. 10A to 10C show, the first terminals 60 and the second terminals 70 are directly connected to the die pad 30 without an auxiliary bar being formed. Note that external terminals included in the SON, the QFN, and so on are generally cannonball-shaped, or oval, square, or rectangular in shape. Therefore, the surfaces of the first terminals 60 and the second terminals 70 that are exposed as external terminals on encapsulation resin 100 are arranged peripheral (in a single line around the periphery) or staggered.

Figure 11A:
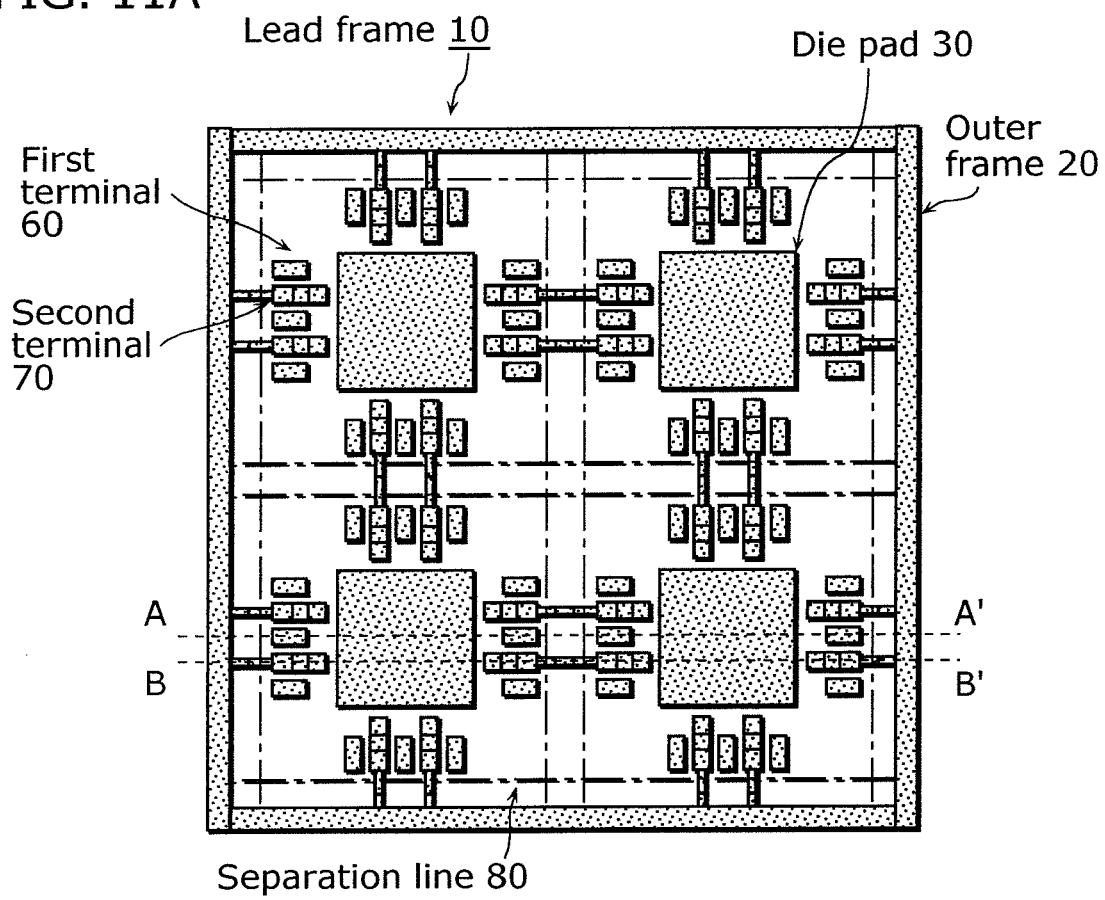
FIGS. 11A to 11C are diagrams showing a finished lead frame before an assembly process, according to the second embodiment of the present invention.

As FIG. 11A shows, the lead frame 10 includes: an outer frame 20, a die pad 30, a first terminal 60, and a second terminal 70. A tape 130 for holding the lead frame 10 is attached to the lower surface of the lead frame 10.

The outer frame 20 is made of metal and formed along the outermost circumference of the lead frame 10.

Inside the outer frame 20, a plurality of electronic component regions 210 are formed. Here, four electronic component regions 21 are formed adjoining each other in an array of 2 rows and 2 columns. At the center of each of the electronic component regions 210, the die pad 30 is formed, and around the die pad 3, the first terminals 60 and the second terminals 70 are formed connected to the die pad 30. Here, the electronic component regions 210 adjoining each other within the outer frame 20 are connected, for example, by connection parts through the second terminals 70.

The first terminals 60 are formed around the die pad 30 for each of the electronic component regions 210 within the outer frame 20. The lower surfaces of the first terminals 60 serve as external terminals after packaging. The first terminals 60, as represented by rectangles in FIG. 10A, are provided in a plurality of lines with respect to each of the electronic component regions 210, between the die pad 30 and a boundary of the electronic component regions 210. In addition, each line includes a first terminal 60.

In addition, the first outer terminal 60 is not connected to the outer frame 20, and therefore is electrically independent.

The second terminals 70 are formed around the die pad 30, with respect to each of the electronic component regions 210 within the outer frame 20. The second terminals 70, as represented by rectangles in FIG. 10A, are provided in a plurality of lines with respect to each of the electronic component regions 210, between the die pad 30 and a boundary of the electronic component regions 210. In addition, each line includes two second terminals 70, which are formed connected to each other.

Here, a second terminal 70 located at the inner side of each line, that is, the one located closer to the die pad 30 is referred to as a second inner terminal 71, and a second terminal 70 located at the outer side of each line, that is, the one located closer to the boundary of the electronic component regions 210 is referred to as a second outer terminal 73. In addition, the part connecting the second inner terminal 71 and the second outer terminal 73 are referred to as a bent part 110.

In addition, the outer frame 20 and the second outer terminal 73 are connected through a joint part 120. Note that as described earlier, the electronic component regions 210 adjoining each other are connected by a connection part that mediates the second outer terminal 73.

In addition, the second inner terminal 71 is mainly used for internal connection, and the second outer terminal 73 is used as an external terminal after packaging.

With each line, bending processing is performed on the bent part 110 that connects the second inner terminal 71 and the second outer terminal 73, and the joint part 120 that connects the second outer terminal 73 and the outer frame 20. Through the bent part 110 and the joint part 120 that are bending-processed, the second outer terminal 73 that serves as an external terminal after packaging is secured at a higher position than the upper surface of the die pad 30.

Figure 11B:
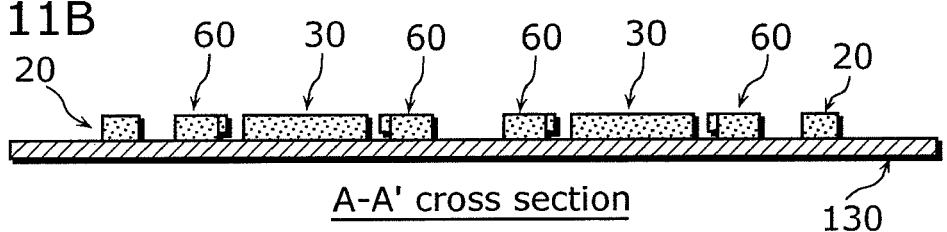
Figure 11C:
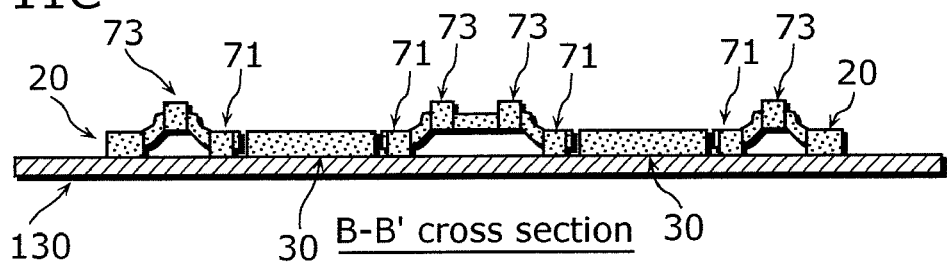

FIGS. 11A to 11C are diagrams showing a finished lead frame 10 before the assembly process, according to the second embodiment of the present invention. FIG. 11A is a plan view of the lead frame 10 before the assembly process, which is not yet assembled into an electronic component. FIG. 11B is a cross-sectional view of the lead frame 10 at A-A' in FIG. 11A. FIG. 11C is a cross-sectional view of the lead frame 10 at B-B' of FIG. 5A. The point modified from FIGS. 10A to 10C is that the die pad 30, the first inner terminal 60, and the second inner terminal 71 are separate.

Figure 12:
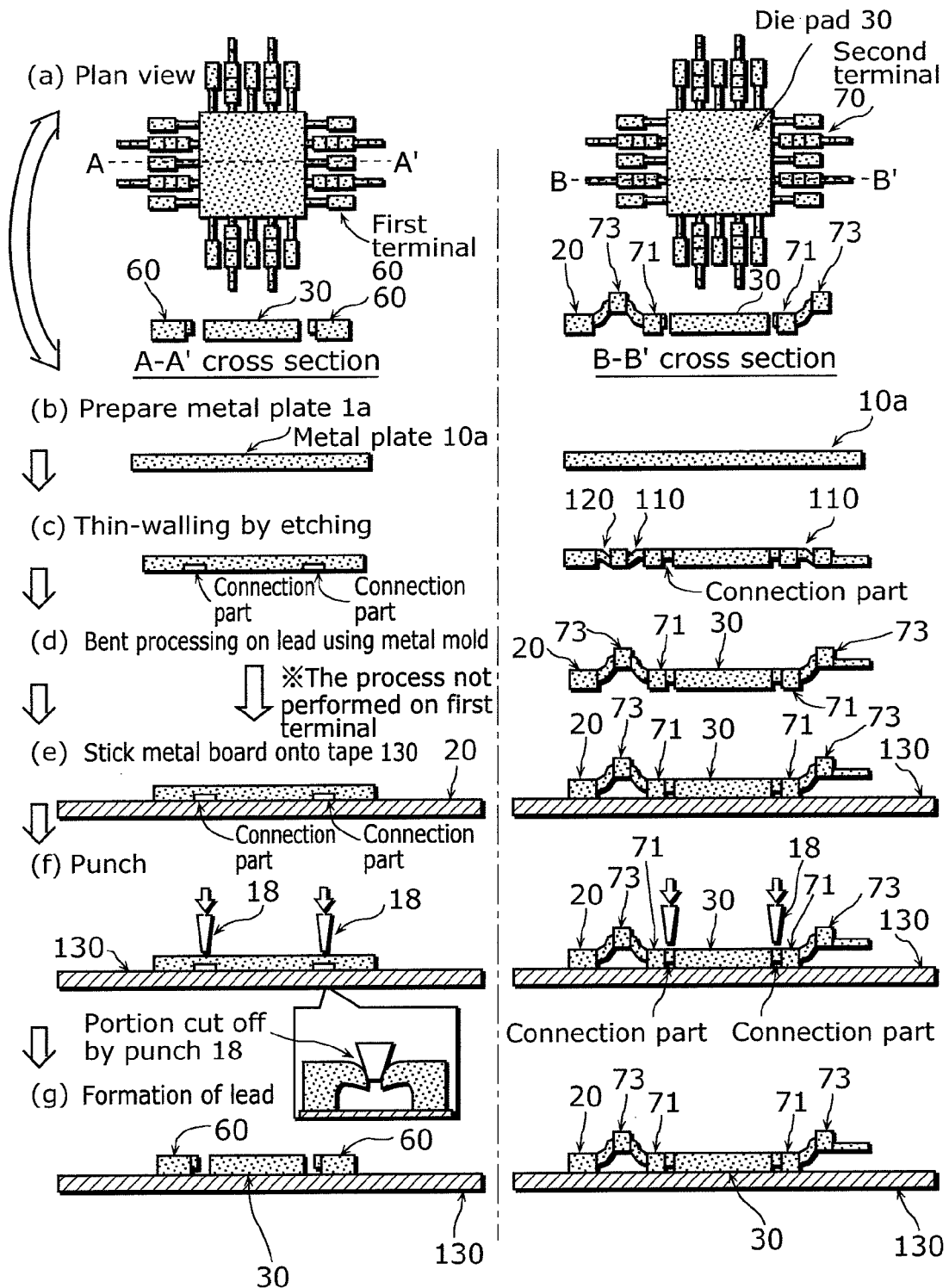
FIG. 12 is a diagram for describing the manufacturing process for the lead frame according to the second embodiment of the present invention.

FIG. 12 is a diagram for describing the manufacturing process for the lead frame 10 according to the second embodiment of the present invention. To facilitate understanding, FIG. 12 shows the manufacturing process of the first terminal 60 on the left, and the manufacturing process of the second terminal 70 on the right.

FIG. 12(a) is a plan view and a cross-sectional view of the lead frame 10 in one of the electronic component regions 210 shown in FIG. 11A.

First, a metal plate 10a that is to be manufactured into the lead frame 10 is prepared (FIG. 12(b)). The metal plate 10a is made of Cu alloy, Fe—Ni (for example, 42 alloy), Al, and the like, and the thickness of the plate ranges from 50 μm to 200 μm. The material and the thickness of the metal plate 10a are selected as appropriate according to the thickness and the intended use of the electronic component.

Next, the lead frame 10 is prepared (FIG. 12(c)). Specifically, by etching and so on, the die pad 30, the first terminals 60, the second terminals 70, and the outer frame 20 are formed from the metal plate 10a. In the process, as described in FIG. 4(a), thin-walling is performed on the lower surface of the joint part that joins the die pad 30 and the first terminal 60, and on the lower surface of the joint part that joins the die pad and the second inner terminal 71. In addition, thin-walling is also performed on a portion that is to be formed into the bent part 110 connecting the second inner terminal 71 and the second outer terminal 73, and a portion that is to be formed into a joint part 120 connecting the second outer terminal 73 and the outer frame 20. Then, the bent part 110 and the joint part 120, after thin-walled, are bending-processed in a subsequent process.

Here, as with the first embodiment, the bent part 110 is connected to the lower portion of the second outer terminal 73 that serves as an external terminal after packaging, and to the upper potion of the second inner terminal 71. In addition, the joint part 120 is connected to the lower portion of the second outer terminal 73 that serves as an external terminal after packaging, and to the upper portion of the outer frame 20.

Note that the bent part 11 is thin-walled so as to be thinner than the second outer terminal 73 and the second inner terminal 71, thereby having half or less than half the thickness of the second outer terminal 73 and the second inner terminal 71. The joint part 120 is thin-walled so as to be thinner than the second outer terminal 73 and the outer frame 20, thereby having half or less than half the thickness of the second outer terminal 73 and the outer frame 20.

In addition, thin-walling may be performed by etching or coining processing.

Next, the bent part 110 and the joint part 120, after thin-walled through metallic molding, are bending-processed (FIG. 12 (*d*)).

That is, the second terminal 70 is processed from the status shown in FIG. 12(*c*) (right) to the status shown in FIG. 12(*d*) (right). The bent part 110 and the joint part 120 can be bending-processed comparatively easily since they are thin-walled as described earlier. In addition, the thickness of the lead frame 10 after bending is designed according to the thickness of the electronic component after resin encapsulation.

Here, assuming, for example, that the thickness of the original metal plate 10*a* is 80 μm, the degree of bending can be easily adjusted so that the thickness of the lead frame 10 after the bending is within a range of 1- to 3-fold, that is, the thickness ranging from 80 μm to 240 μm. In other words, this allows flexible positioning of the upper and lower external terminals in design such that the thickness of the electronic component after resin encapsulation is between 80 μm and 240 μm.

Next, the lead frame 10 is attached to the tape 130 (FIG. 12(*e*)).

Specifically, the lower surface of the lead frame 10, that is, the lower surfaces of the outer frame 20, die pad 30, and the first terminals 60 are held and secured onto the tape 130.

Next, the thin-walled connection parts between the die pad 30 and the first terminals 60 and between the die pad 30 and the second terminals 70 are cut off by using a punch 18 (FIG. 12(*f*)).

Here, as FIG. 12(*f*) shows, the cut surface of the connection part, which has been thin-walled and cut off, has a shape of a "peaked roof" or a "mushroom cap." Note that the cut surface has a shape as described above when a metallic mold such as the punch 18 is used for cutting, but marks of fusing (dross) are left at cut points when a laser or the like is used.

Then, the lead frame 10 is formed within the electronic component region 210 (FIG. 12(*g*)).

Figure 13A:
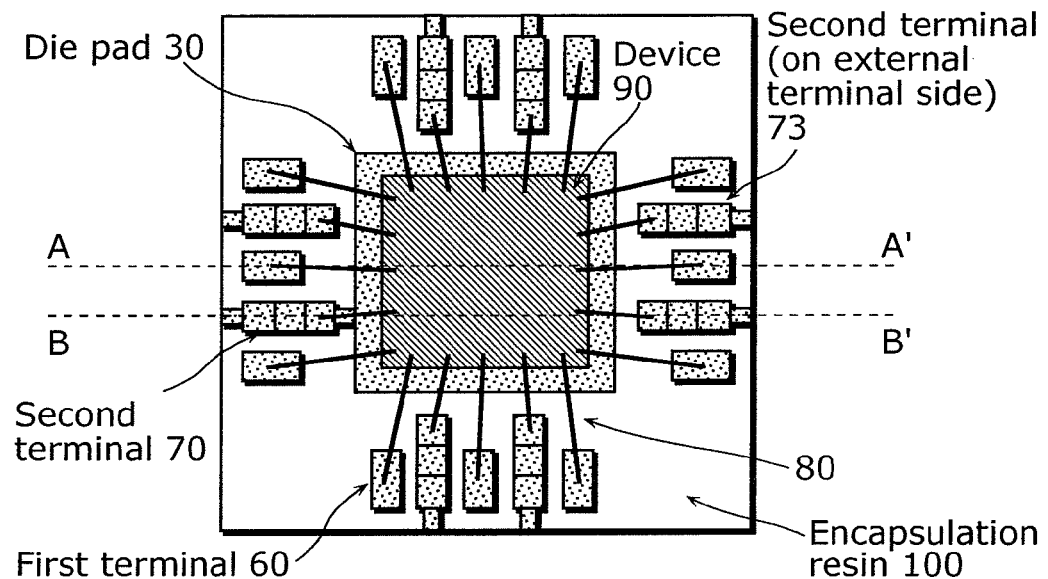
FIGS. 13A to 13C are diagrams showing a finished electronic component after the assembly process, according to the second embodiment of the present invention.
Figure 13B:
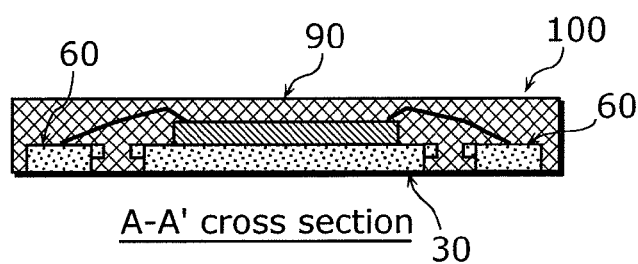
Figure 13C:
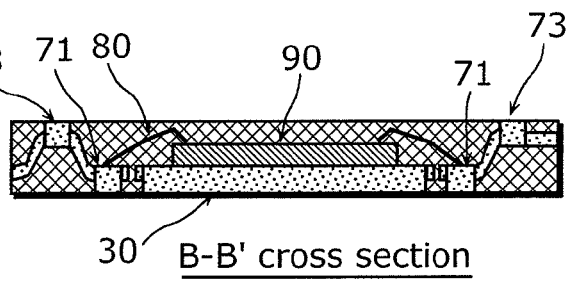

FIGS. 13A to 13C are diagrams showing a finished electronic component after the assembly process, according to the second embodiment of the present invention. FIG. 13A is a plan view of the finished electronic component after the assembly process, assuming the encapsulation resin 100 as transparent. FIG. 13B is a cross-sectional view at A-A' of the finished electronic component after the assembly process shown in FIG. 13A. FIG. 13C is a cross-sectional view at B-B' of the finished electronic component after the assembly process shown in FIG. 13A. The difference from FIG. 12 is that: the device 90 is mounted on the die pad 30; the device 90 and the terminals of the lead frame 10 are internally connected by the metal wire 80; and the entire electronic component is sealed with the encapsulation resin 100. The internal connection as referred to here is an electrical connection, through the metal wire 80, between the electrode of the device 90, the upper surface of the first terminal 60, and the upper surface of the second inner terminal 71. Here, FIG. 13B shows a characteristic point. More specifically, no metal cut marks are left on the exterior surface of the first terminal 60, that is, the lateral side of the electronic component. This is because the lead frame 10 is designed, in its structural phase, such that the electronic component regions 210 adjoining each other are not connected through the first terminals 60.

Note that the second embodiment describes the structure in which the device 90 is smaller than the die pad 30, but the device 90 may be larger than the die pad 30, and may also be applied to an FC type in which the electrodes of the principal surface of the device 90 are directly connected to the terminals through bumps (not shown).

Figure 14A:
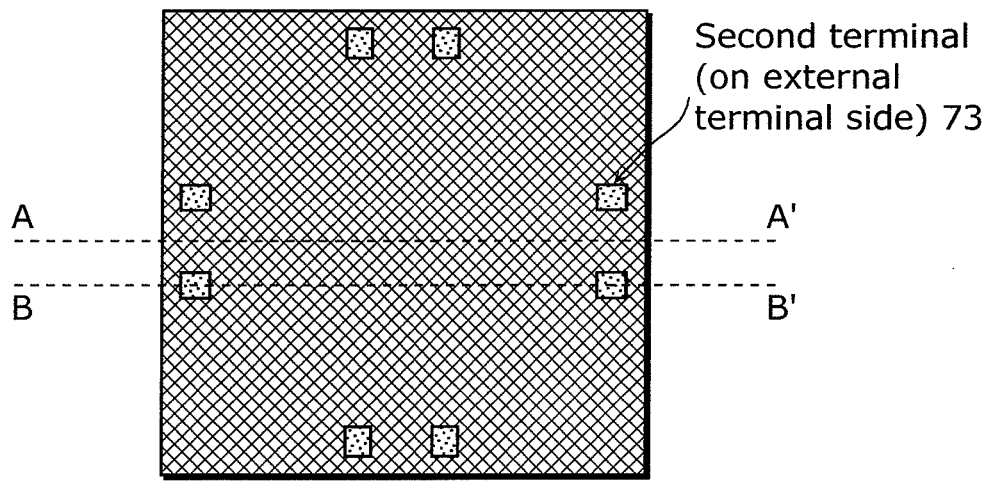
FIGS. 14A to 14D are external views of a finished electronic component after the assembly process, according to the second embodiment of the present invention.

FIGS. 14A to 14D are external views of a finished electronic component after the assembly process, according to the second embodiment of the present invention. FIG. 14A is an external view from above of the finished electronic component after the assembly process.

Figure 14B:
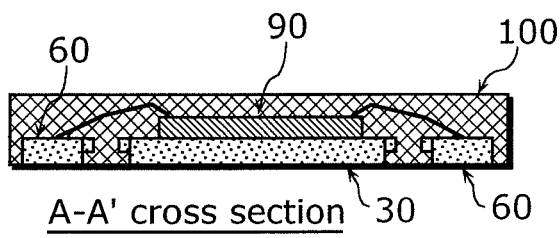
Figure 14C:
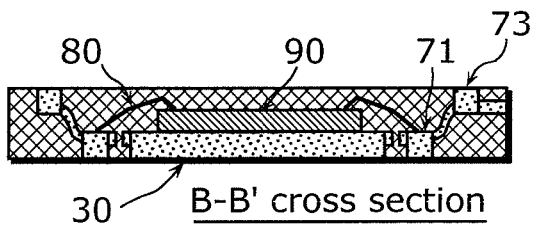
Figure 14D:
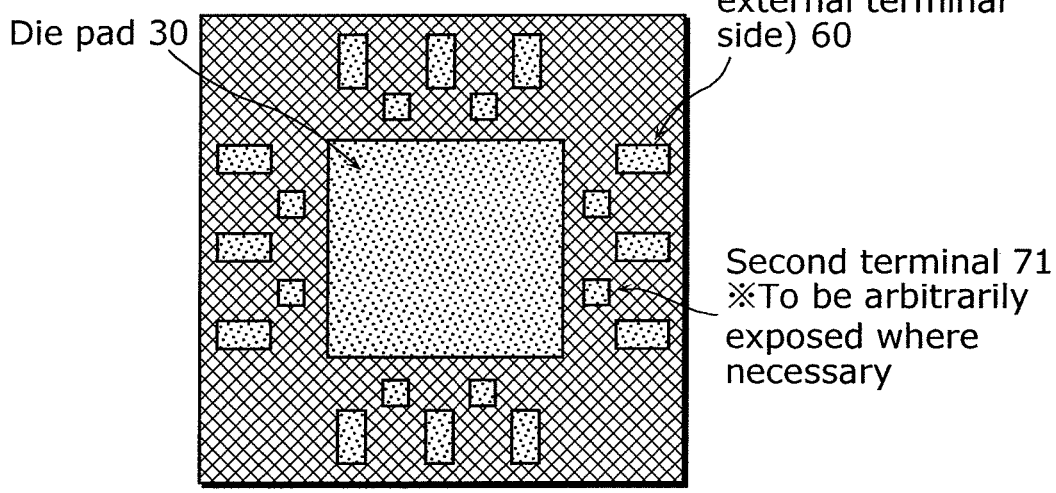

FIG. 14B is a cross-sectional view at A-A' of the finished electronic component after the assembly process shown in FIG. 14A. FIG. 14C is a cross-sectional view at B-B' of the finished electronic component after the assembly process shown in FIG. 14A. FIG. 14D is an external view from below of the finished electronic component after the assembly process.

As seen from the external views of FIGS. 14A and 14D and the cross-sectional view of FIGS. 14B and 14C, the portion that is to be exposed on either side of the electronic components is a portion designed to be external terminals, that is, only the lower surfaces of the first terminals 60 and the upper surface of the second outer terminals 73.

Note that the number and the structure of the upper and lower terminals can be designed and modified according to the application.

In addition, the lower surface of the second inner terminal 71 may be designed to serve as an external terminal that is exposed on the backside of the electronic component.

In addition, in FIG. 14D, the first terminals 60 and the second outer terminals 73 that serve as external terminals are arranged in a staggered state, but such terminals may be arranged in parallel or in a line. In addition, the external terminals, that is, the lower surfaces of the first terminals 60 and the upper surface of the second outer terminal 73 may selectively be cannonball-shaped, or oval, square, rectangular, or circular in shape as appropriate.

As described thus far, according to the second embodiment of the present invention, it is possible to readily adjust the height of the second outer terminal 73 that serves as an external terminal, by including the bent part 11 and the joint part 12 and performing bending processing onto the bent part 11 and the joint part 12. This allows realization of the lead frame 10 including upper and lower external terminals and an electronic component including the lead frame, using a single piece of lead frame, without using a wiring board. In addition, with such flexibility in designing the position and the area size of the second outer terminal 73 that serves as an external terminal, it is possible to ensure the diversity of designs. That is, this facilitates the manufacturing of the lead frame 10 including upper and lower external terminals and the electronic component including the lead frame.

In addition, since no separation frame is provided at the boundary of the electronic component regions 210, it is possible to significantly reduce the stress onto the dicing blade 81 resulting from the cutting of the lead frame 10 for each electronic component region 210, thereby making the life of the dicing blade 81 longer. In addition, since no separation frame is provided at the boundary of the electronic component regions 21, it is possible to significantly reduce the number of cut surfaces in the metal cut off by the dicing blade 81 as compared to the conventional lead frame including a separation frame, thereby preventing contact failure caused by metal burrs in the electronic component including the lead frame 1. This makes it possible to realize a lead frame, an electronic component including the lead frame, and a method of manufacturing thereof that allow easy manufacturing and cost reduction while preventing decreases in reliability.

In addition, the lead frame according to the present invention and the electronic component including the lead frame allow flexible positioning of the second outer terminals 73 that serve as the upper and lower terminals, thereby making it possible to design so as to reduce various stresses onto the lead frame of the present invention and the electronic component including the lead frame.

In addition, the lead frame according to the present invention and the electronic component including the lead frame allow flexible selection of the size of an area in the second external terminals 73 that serves as the upper and lower external terminals, thereby making it possible to secure the connection strength between the lead frame of the present invention and an electronic component that is to be mounted onto the electronic component including the lead frame, and to prevent decreases in reliability.

In addition, with flexibility in designing the position of the upper and lower external terminals of the electronic component through bending the lead frame after assembly, it is possible to reduce various stresses, thereby securing connection reliability.

In addition, the method of manufacturing the electronic component including the lead frame has enabled quality improvement and cost reduction, by eliminating the use of the separation frame between each electronic component region, which has conventionally been a requisite for the lead frame intended for collective molding.

In addition, the lead frame of the present invention and the electronic component including the lead frame are structured, using a lead frame, without requiring the use of a wiring board for forming external terminals on the lower and upper surfaces. Therefore, the faces of the external terminals on the upper surface do not require any grinding or polishing process after assembly into the electronic component.

In addition, with the lead frame 10 including upper and lower external terminals realized by using a single piece of lead frame, it is possible to achieve cost reduction without extra material costs incurred.

In addition, easy manufacturing of the electronic component and the semiconductor device including upper and lower terminals by using a single piece of lead frame facilitates three-dimensional mounting in which components are mounted onto an electronic component. This also diversifies a range of designs on the mounting board, and achieves the mounting at reduced costs.

In addition, the exemplary application of the electronic component including the lead frame of the present invention includes applications widely used in: 2-pin or 3-pin batteries or the like, diodes, functional or passive components, MEMS having 4 to 200 pins, semiconductor devices, and so on.

In addition, the package form of the electronic component including the lead frame of the present invention is widely applicable to: discreet packages such as TO and MINI, SON, QFN, LGA, BGA, and so on. In addition, it is also possible to arrange external terminals in three or four lines, using the manufacturing method of the present invention.

In addition, with provision of a plurality of passive or positive chips on top of the electronic component including the lead frame of the present invention, it is possible to improve electric characteristics as an electronic component as compared to the conventional case where passive or positive chips are arranged around the electronic component. It is also possible, for example, to reduce the mounting area on the mounting board, such as a mother board, onto which electronic components are mounted. In addition, with passive and positive chips being separately exposed on the upper and lower surfaces for electric connections, it is possible to facilitate the complicated wiring within the electronic component and so on, producing an effect of stabilizing the yield of the equipment and so on in manufacturing.

Thus far, the lead frame of the present invention, the electronic component including the lead frame, and the manufacturing method thereof have been described based on some embodiments, but the present invention is not limited to such embodiments. Those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention can be applied to a lead frame, an electronic component including the lead frame, and a manufacturing method thereof, and particularly to digital appliances, such as is cellular phones, cellular terminals, DVD apparatuses, and digital TVs.

What is claimed is:

1. A lead frame used for internal wiring of a package of a device and for connecting the device to external wiring, said lead frame comprising:
   an outer frame; and
   a plurality of electronic component regions adjoining each other within said outer frame,
   wherein each of said plurality of electronic component regions includes:
   a die pad on which the device is mounted;
   a first connection terminal, a lower surface of which serves as an external terminal, said first connection terminal being provided around said die pad and electrically independent of said die pad;
   a second connection terminal, an upper surface of which serves as an external terminal, said second connection terminal being provided around said die pad and electrically independent of said die pad; and
   a bent part that is provided between said first connection terminal and said second connection terminal, and that connects said first connection terminal and said second connection terminal,
   said bent part is bending-processed in a direction perpendicular to a face of said die pad, and
   said plurality of electronic component regions adjoining each other is connected through said first or said second connection terminal.

2. The lead frame according to claim 1,
   wherein the upper surface of said second connection terminal is positioned higher than upper surfaces of said first connection terminal and said die pad.

3. The lead frame according to claim 1,
   wherein said bent part is thinner than said second connection terminal and is formed connected to a lower portion of said second connection terminal.

4. The lead frame according to claim 3,
   wherein said bent part is half or less than half a thickness of said second connection terminal.

5. The lead frame according to claim 3,
   wherein said bent part is thinner than said first connection terminal and is formed connected to an upper portion of said first connection terminal.

6. The lead frame according to claim 5,
wherein said bent part is half or less than half a thickness of said first connection terminal.

7. The lead frame according to claim 1,
wherein the lower surface of said first connection terminal and a lower surface of said outer frame are adhered to tape and secured.

8. An electronic component comprising:
said lead frame according to claim 1; and
a device mounted on said die pad in said lead frame and including an electrode,
wherein said electrode is electrically connected to an upper surface of said first connection terminal by metal wiring,
said lead frame and said device are sealed with resin so as to be encapsulated, and
the lower surface of said first connection terminal is exposed on the resin.

9. The electronic component according to claim 8,
wherein the upper surface of said second connection terminal is exposed on the resin.

10. The electronic component according to claim 9,
wherein a connection part that connects, through the second connection terminal, said plurality of electronic component regions adjoining each other is cut off, and
a cut surface of the connection part is exposed on the resin.

11. The electronic component according to claim 10,
wherein said bent part is bending-processed so that the cut surface of the connection part, which is cut off and exposed on the resin, is half a height of said electronic component.

12. A method of manufacturing a lead frame used for internal wiring of a package of a device and for connecting the device to external wiring, said method comprising:
forming, through etching of a metal plate, an outer frame, a die pad on which the device is mounted, and first and second connection terminals around the die pad, the first and second terminals serving as external terminals that are integrally connected to the die pad;
thin-walling a joint part that joins the first connection terminal and the die pad, and a bent part that is provided between the first and the second connection terminals and is integrally connected to the first and the second connection terminals;
bending, into a direction perpendicular to a face of the die pad, the bent part that is thinned in said thin-walling;
securing, using tape, the outer frame and a lower end of the first connection terminal; and
cutting off, after said securing, the joint part thinned in said thin-walling, so that the first connection terminal and the die pad are electrically independent.

13. The method of manufacturing a lead frame according to claim 12,
wherein in said thin-walling, the bent part is thinned so as to lead to a lower portion of the second connection terminal.

14. The method of manufacturing a lead frame according to claim 13,
wherein in said thin-walling, the bent part is thinned so as to lead to an upper portion of the first connection terminal.

15. The method of manufacturing a lead frame according to claim 12,
wherein in said bending, an upper surface of the second connection terminal is positioned higher than upper surfaces of the first connection terminal and the die pad by the bending of the thin-walled bent part.

16. The method of manufacturing a lead frame according to claim 12,
wherein in said securing, the second connection terminal is secured above the tape in a state of being suspended in the air.

17. The method of manufacturing a lead frame according to claim 12,
wherein a plurality of lead frames is formed in manufacturing the lead frame,
in said forming, an outer frame is further formed for the lead frame, which includes a plurality of electronic component regions each including the die pad and the first and the second connection terminals as one electronic component region,
within the outer frame, the plurality of electronic component regions are formed adjoining each other, the electronic component regions including the die pad and the first and the second connection terminals, and
the plurality of electronic component regions adjoining each other is connected through the first or the second connection terminal.

\* \* \* \* \*